(12) United States Patent
Lau et al.

(10) Patent No.: US 8,642,363 B2
(45) Date of Patent: Feb. 4, 2014

(54) MONOLITHIC FULL-COLOR LED MICRO-DISPLAY ON AN ACTIVE MATRIX PANEL MANUFACTURED USING FLIP-CHIP TECHNOLOGY

(75) Inventors: Kei May Lau, Hong Kong (CN); Zhaojun Liu, Hong Kong (CN)

(73) Assignee: Nano and Advanced Materials Institute Limited, Hong Kong (CN)

( * ) Notice: Subject to any disclaimer, the term of this patent is extended or adjusted under 35 U.S.C. 154(b) by 32 days.

(21) Appl. No.: 13/466,660

(22) Filed: May 8, 2012

(65) Prior Publication Data
US 2012/0223875 A1  Sep. 6, 2012

Related U.S. Application Data

(63) Continuation-in-part of application No. 13/130,442, filed as application No. PCT/US2010/036900 on Jun. 1, 2010.

(60) Provisional application No. 61/267,894, filed on Dec. 9, 2009.

(51) Int. Cl.
    *H01L 21/00* (2006.01)
(52) U.S. Cl.
    USPC ...................... 438/28; 257/E21.499
(58) Field of Classification Search
    USPC ........................... 438/35, 237, 604
    See application file for complete search history.

(56) References Cited

U.S. PATENT DOCUMENTS

| | | | |
|---|---|---|---|
| 5,859,474 A | 1/1999 | Dordi | |
| 6,541,294 B1 * | 4/2003 | Yamazaki et al. | 438/29 |
| 7,052,930 B2 * | 5/2006 | Park et al. | 438/66 |
| 7,354,846 B2 | 4/2008 | Kim et al. | |
| 2002/0005819 A1 | 1/2002 | Ronzani et al. | |
| 2008/0310005 A1 | 12/2008 | Tonar et al. | |

* cited by examiner

*Primary Examiner* — Chandra Chaudhari
(74) *Attorney, Agent, or Firm* — Nath, Goldberg & Meyer; Jerald L. Meyer; Stanley N. Protigal

(57) ABSTRACT

A high-resolution, Active Matrix (AM) programmed monolithic Light Emitting Diode (LED) micro-array is fabricated using flip-chip technology. The fabrication process includes fabrications of an LED micro-array and an AM panel, and combining the resulting LED micro-array and AM panel using the flip-chip technology. The LED micro-array is grown and fabricated on a sapphire substrate and the AM panel can be fabricated using PMOS process, NMOS process, or CMOS process. LED pixels in a same row share a common N-bus line that is connected to the ground of AM panel while p-electrodes of the LED pixels are electrically separated such that each p-electrode is independently connected to an output of drive circuits mounted on the AM panel. The LED micro-array is flip-chip bonded to the AM panel so that the AM panel controls the LED pixels individually and the LED pixels exhibit excellent emission uniformity. According to this constitution, incompatibility between the LED process and the PMOS/NMOS/CMOS process can be eliminated.

27 Claims, 20 Drawing Sheets
(10 of 20 Drawing Sheet(s) Filed in Color)

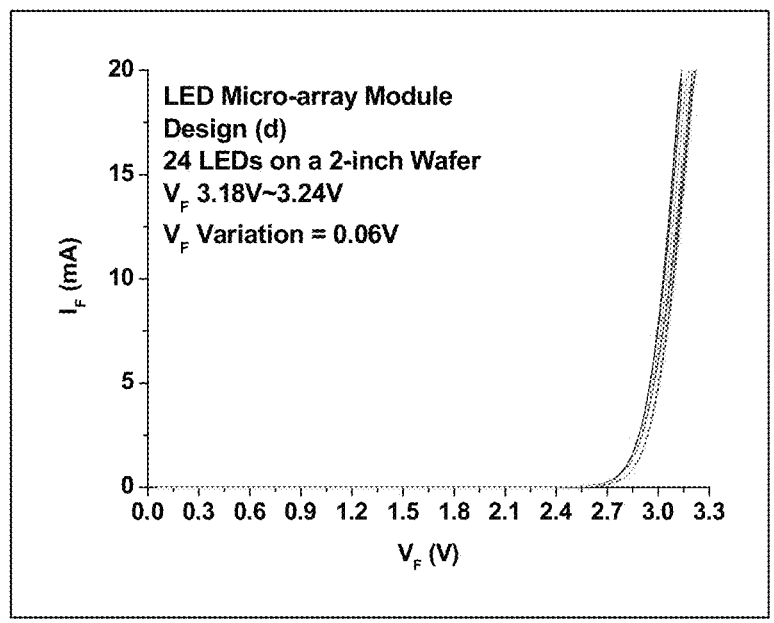
FIG. 19
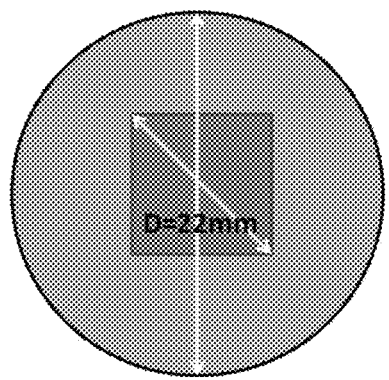
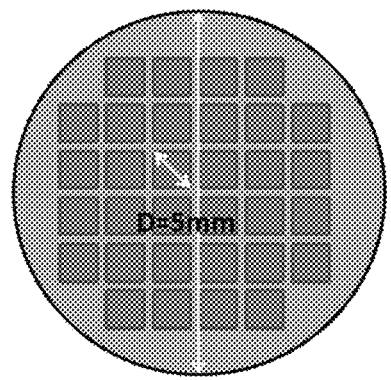
FIG. 20A  FIG. 20b

| Combination | Structure | advantage |
|---|---|---|
|  | RRGB: 2 red pixels, 1 green pixel and 1 blue pixel | Optimize color balance |
|  | RGGB: 1 red pixel, 2 green pixels and 1 blue pixel | Optimize color balance |
|  | RGBB: 1 red pixel, 1 green pixel and 2 blue pixels | Optimize color balance |
|  | WRGB: 1 white pixel, 1 red pixel, 1 green and blue pixel | Optimize color balance Improve brightness |

MONOLITHIC FULL-COLOR LED MICRO-DISPLAY ON AN ACTIVE MATRIX PANEL MANUFACTURED USING FLIP-CHIP TECHNOLOGY

RELATED APPLICATION(S)

This is a continuation-in-part application of U.S. patent application Ser. No. 13/130,442, filed May 20, 2011, which claims priority to International Patent Application PCT/US10/36900, filed Jun. 1, 2010, which claims priority to U.S. Provisional Application No. 61/267,894 filed Dec. 9, 2009, which is assigned to the assignee hereof and filed by the inventors hereof and which is incorporated by reference herein.

BACKGROUND

1. Field

The present subject matter relates generally to manufacturing a large scale full-color Light Emitting Diode (LED) on silicon micro-display, and more specifically to manufacturing an LED micro-display mounted on an Active Matrix (AM) panel using flip-chip technology.

2. Background

LED array displays made with individually packaged devices have been widely used for various applications. In recent years, different techniques have been exploited to fabricate monolithic, passively-addressable LED arrays. The array dimensions and pixel brightness in conventional passively-addressable LED arrays were limited by the loading effect in the same row or column. Thus, various new address schemes and fabrication technologies are suggested to improve the operating effectiveness of monolithic LED arrays.

For example, U.S. Pat. Nos. 5,789,766, 5,827,753, and 5,893,721 relate to methods of fabricating an LED array and driving circuitry that includes sequentially forming overlying layers of material on the surface of a semiconductor substrate, the layers cooperating to emit light when activated. The insulating layer is formed on the layers and the layers are isolated into an array area and the driver circuitry area with row and column drivers dividing the array area into an array of LEDs arranged in rows and columns. Row and column driver circuits are formed on the insulating layer in the driver circuitry area. Row buses individually couple each LED in the array to corresponding driver circuits. But the circuitry layer formed on the insulating layer can only be a thin film device like amorphous Silicon Thin Film Transistor (a-Si TFT) or poly-Si TFT; however, these have low field effect mobility and cannot provide enough current for the LEDs. On the other hand, these three patents adopt a bottom-emitting configuration and the aperture of the array is limited by the circuitry area, thereby resulting in a relatively low light efficiency.

U.S. Patent Application Publication No. 2008/0194054 relates to a method of fabricating an LED array package structure having a silicon substrate. The LED array package structure includes a silicon substrate having a plurality of cup-structures thereon, a reflective layer disposed on the silicon substrate, a transparent insulation layer disposed on the reflective layer, a conductive layer disposed on the transparent insulation layer and a plurality of LEDs disposed respectively on the conductive layer in each cup-structure. In this way, the LED array can only operate in a passive mode and each LED size is as large as tens millimeters. Hence, the LED arrays made by this method often suffer from bad illumination uniformity and the low resolution.

U.S. Pat. No. 6,975,293 relates to five types of driving circuits for an active matrix LED display. The circuits are composed of four MOS transistors, each of which has a drain and a source. An anode of an LED is coupled to a source of a driving transistor and a cathode of the LED is coupled to a second voltage. These methods are suitable for an OLED array display, but not suitable for a semiconductor LED micro-display array because the LED process is not compatible with the CMOS process due to thermal issue and process compatibility.

U.S. Patent Application Publication No. 2008/0171141 relates to methods of fabricating LED array structures including multiple vertical LED stacks coupled to a single metal substrate. Such an LED array may offer better heat conduction and an improved matching of LED characteristics (e.g., forward voltage and emission wave length) between the individual LED stacks compared to conventional LED arrays. But the LED array in this reference can only act as a single LED which can only light on and off together and cannot control the LED pixel individually and precisely.

U.S. Pat. No. 5,998,925 discloses a white light emitting diode having a light emitting component which uses a semiconductor as a light emitting layer and a phosphor which is excited by the light emitted by the light emitting layer and emitted light with wavelength varied from the excitation light. The light emitting layer of the light emitting component is a nitride compound semiconductor and the phosphor contains garnet fluorescent material activated with cerium which contains at least one element selected from the group consisting of Y, Lu, Sc, La, Gd and Sm, and at least one element selected from the group consisting of Al, Ga and In and is subject to less deterioration of emission characteristic even when used with high luminance for a long period of time.

U.S. Published Patent Application 2006-0154390 discloses systems and methods for producing vertical LED array on a metal substrate; evaluating said array of LEDs for defects; destroying one or more defective LEDs; forming good LEDs only LED array suitable for wafer level package. Advantages of the system may include one or more of the following. The above system provide manufacturing processes suitable for fabricating and testing or unpackaged vertical LEDs on metal substrate. The present method of manufacturing and checking LEDs is suitable for the burn-in and checking in practice all kind of LEDs, especially the vertical LED on metal substrate described in this disclosure. It is highly economical because it provides testing before final component fabrication, making the present method highly reliable in comparison with conventional methods. In addition to enhancing the standard manufacturing testing for LEDs, the system can be a major development for producing good LEDs array U.S. Pat. No. 7,811,842 discloses methods for fabricating LED array structures comprising multiple vertical LED stacks coupled to a single metal substrate is provided. The LED array structure may comprise two, three, four, or more LED stacks arranged in any configuration. Each of the LED stacks may have an individual external connection to make a common anode array since the p-doped regions of the LED stacks are all coupled to the metal substrate, or some to all of the n-doped regions of the LED stacks may be electrically connected to create a parallel LED array. Such LED arrays may offer better heat conduction and improved matching of LED characteristics (e.g., forward voltage and emission wavelength) between the individual LED stacks compared to conventional LED arrays.

SUMMARY

A monolithic Light Emitting Diode (LED) micro-display panel is manufactured on an Active Matrix (AM) panel. The LED microarray panel comprises a plurality of LED pixels each including an n electrode and a p electrode, with the LED pixels arranged in a matrix including a plurality of rows and a plurality of columns, n electrodes of LED pixels in a row of the matrix, electrically connected to a bus line, the p electrode of each LED pixel individually electrically connected to an output of a corresponding driving circuit on the AM panel. A substrate of the LED micro-display panel is provided and the substrate is overlaid with a plurality of layers of material configured in combination to emit light when activated. The layers are patterned and a current spreading layer is deposited on the pattern and on the surface of the substrate. A metal multilayer is applied on the current spreading layer and patterned to form the monolithic LED micro-display panel. A plurality of active control circuits on a surface of the AM panel are configured, in which active control circuit has a two-transistor-one-capacitor (2T1C) structure. The LED micro-display panel is combined with the AM panel using conductive solder material, with each of the monolithic LEDs independently controllable by corresponding ones of the active control circuit chips, with the AM panel, pixel size and shape correspond to LED pixels.

In a further configuration, the LED pixels are grouped in groups of four pixels, with the LEDs emitting a single color of light for all pixels. A mold configured to accept phosphors for the individual pixels in each group accepts the phosphors which are applied to the mold to transmit at least 3 primary transmission colors for respective ones of the pixels in each group. A fourth pixel in the group to transmit light, in which the light transmitted by the fourth pixel can be one of selected from the group consisting of one of the three primary colors, white light, a non-primary color and/or a fourth primary color.

BRIEF DESCRIPTION OF THE DRAWINGS

The file of this patent contains at least one drawing executed in color. Copies of this patent with color drawings will be provided by the Office upon request and payment of the necessary fee.

FIG. 16 are microscopic scale diagrams showing four types of design with different bus line configuration.

FIG. 19 is a graphical diagram showing an array of 24 LED pixels of design (d) of FIG. 3 randomly measured across a 2-inch wafer.

FIGS. 20A and B are diagrams showing utilization rates of a 2-inch LED wafer. In FIG. 20A, only one LED array with 22 mm in diagonal is obtained. In FIG. 20B, 32 LED arrays with 5 mm in diagonal can be obtained.

FIG. 23 is a chart showing four different combinations of the full-color pixels.

DETAILED DESCRIPTION

Overview

Figure 1:
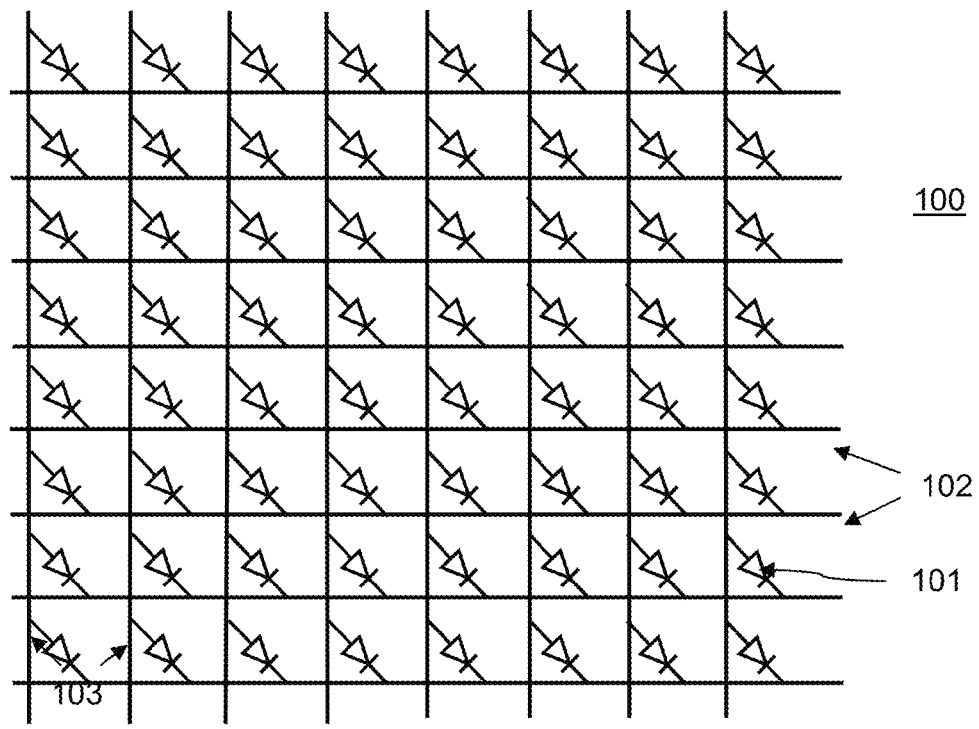
FIG. 1 is a simplified prior art schematic diagram of a top plan view of a passive LED matrix.

The present subject matter provides a method for manufacturing a monolithic LED micro-display on an active matrix panel including a plurality of active control circuits with a two-transistor-one-capacitor (2T1C) structure using flip-chip technology and a display apparatus having the monolithic LED micro-display. The technique is used to manufacture a Light Emitting Diodes on Silicon (LEDoS) display using flip-chip technology and a display apparatus having a full-color LED micro-display capability.

According to an aspect, the subject matter is directed to a method for manufacturing a monolithic Light Emitting Diode (LED) micro-display panel on an Active Matrix (AM) panel, the LED microarray panel comprising a plurality of LED pixels each including an n-electrode and a p-electrode, the LED pixels being arranged in a matrix including a plurality of rows and a plurality of columns, n-electrodes of LED pixels in a row of the matrix being electrically connected to a bus line, the p-electrode of each LED pixel being individually electrically connected to an output of a corresponding driving circuit on the AM panel, the method comprising: providing a substrate of the LED micro-display panel; overlaying a plurality of layers of material on a surface of the substrate, the plurality of overlaying layers of material being configured in combination to emit light when activated; patterning the plurality of overlaying layers of material by removing a part of each overlaying layers all the way down to the surface of the substrate; depositing a current spreading layer on the patterned plurality of overlaying layers of material and surface of the substrate; providing a metal multilayer on the current spreading layer; patterning the metal multilayer in such a configuration that a first portion of the metal multilayer, which lies on the patterned plurality of overlaying layers of material, and a second portion of the metal multilayer, which lies on the surface of the substrate, are conductively disconnected, thereby forming the monolithic LED micro-display panel; providing a plurality of active control circuits on a surface of the AM panel in such a way that each active control circuit has a two-transistor-one-capacitor (2T1C) structure, which comprises a first transistor (T1) as a switch transistor, a second transistor (T2) as a driving transistor, and a capacitor (C), a gate electrode of the second transistor (T2) being electrically connected to a drain electrode of the first transistor (T1) and an end of the capacitor (C); and combining the monolithic LED micro-display panel with the AM panel using conductive solder material, each of the monolithic LEDs being electrically insulated from one another and independently controllable by corresponding one of the active control circuit chips bonded thereto, wherein the plurality of active control circuits are combined with the monolithic LEDs in such a way that each of the plurality of active control circuits is combined with one of the monolithic LEDs of the LED microarray panel via the solder material.

According to another aspect, the subject matter is directed to a method for manufacturing an assembly of a monolithic Light Emitting Diode (LED) micro-display panel including a plurality of LEDs thereon and an Active Matrix (AM) panel, comprising: providing a substrate of the AM panel; providing active control circuit chips on the substrate of the AM panel, wherein a plurality of active control circuits are mounted on a surface of the AM panel in such a way that each active control circuit has a two-transistor-one-capacitor (2T1C) structure, which comprises a first transistor (T1) as a switch transistor, a second transistor (T2) as a driving transistor, and a capacitor (C), a gate electrode of the second transistor (T2) being electrically connected to a drain electrode of the first transistor (T1) and an end of the capacitor (C); providing conductive solder material on the active control circuit chips; and combining the AM panel with the monolithic LED micro-display panel in such a configuration that the active control circuit chips are flip-chip bonded to the plurality of monolithic LEDs via the conductive solder material.

According to a further aspect, the subject matter is directed to a Light Emitting Diode (LED) display comprising: a LED panel mounted with a plurality of LEDs arranged in rows and columns; and an Active Matrix (AM) panel mounted with a plurality of active control circuits, wherein the LED panel is combined with the AM panel in such a configuration that each of the plurality of LEDs is associated with each of the active control circuits, each pair of an LED and an associated active control circuit being electrically insulated from other pairs of LEDs and associated active control circuits in the LED display, each LED being independently controllable by each associated active control circuit, wherein the AM panel has a surface on which a plurality of active control circuits are mounted in such a way that each active control circuit has a two-transistor-one-capacitor (2T1C) structure, which comprises a first transistor (T1) as a switch transistor, a second transistor (T2) as a driving transistor, and a capacitor (C), a gate electrode of the second transistor (T2) being electrically connected to a drain electrode of the first transistor (T1) and an end of the capacitor (C).

While an 8×8 monolithic blue light LED on Silicon (LEDoS) display can exhibit good display uniformity and driving capability, it is desired to have a larger display in order to meet the requirements of commercial applications on the market. These applications include "real LED" TV sets, monitors of desktop and laptop computers, and message displays for many household electrical appliances such as microwave ovens, air conditioners, refrigerators, and electronic albums. Commercial applications also require red, green, blue (RGB) colors to produce full-color images. A large area display requires the LEDoS technology to have a scale-up ability to display more information on the screen.

The present disclosure provides large-scale and full-color Light Emitting Diodes on Silicon (LEDoS) display, which is fabricated using flip-chip technology. The forward voltage uniformity of the LED pixels was greatly improved by a double-side ground structure. A basic LED micro-array module was fabricated and the AM substrate has scaling-up ability. By integrating a certain number of LED micro-array modules onto a large-scale AM substrate, a large-scale display is obtained. With the scale-up ability, display panels with resolution of 24×24 and diagonal of 2.2 cm were fabricated. By this scaling-up method, the utilization rate of the LED wafers is greatly increased, and the yield of the LED pixels is improved simultaneously. Red, green and blue phosphors are excited by UV light to get a full-color display. Optionally, a white or yellow phosphor is excited by ultraviolet (UV) light to provide white light. A silicon mold is fabricated with cells to locate individual color phosphors onto the surface of the LEDoS display panel.

EXAMPLES

The Figures are diagrammatic and not drawn to scale. In the Figures, elements which correspond to elements already described have the same reference numerals.

Figure 2:
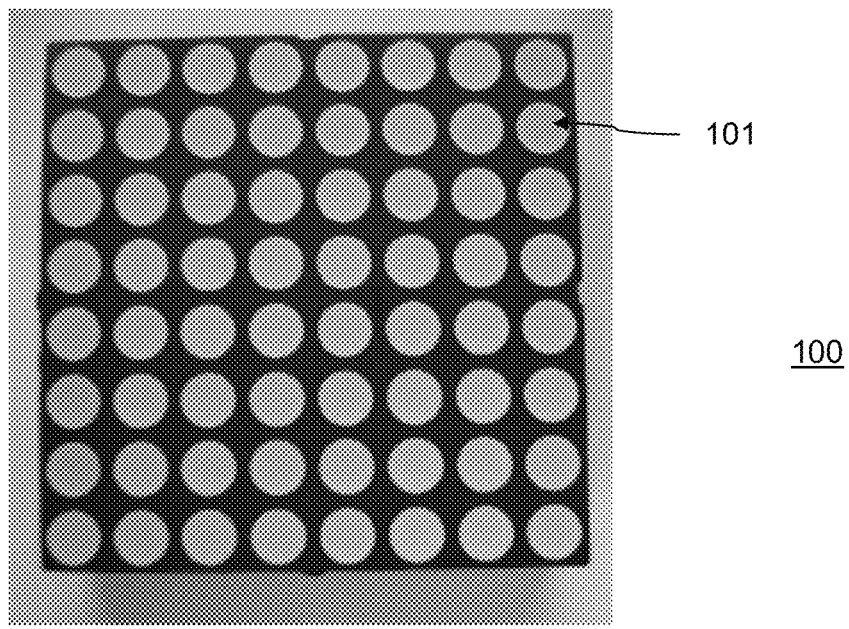
FIG. 2 is a diagram showing a top plan view of the prior art passive LED matrix, as schematically shown in FIG. 1.

FIG. 1 is a simplified schematic diagram of a top plan view of a prior art passive LED matrix 100 wherein the passive LED matrix 100 includes a plurality of LEDs 101 arranged in rows and columns with anodes in a same column connected to one another via column buses 102 and cathodes in a same column connected to one another via row buses 103. FIG. 2 is a diagram showing a top plan view of the prior art passive LED matrix, as schematically shown in FIG. 1.

Figure 3:
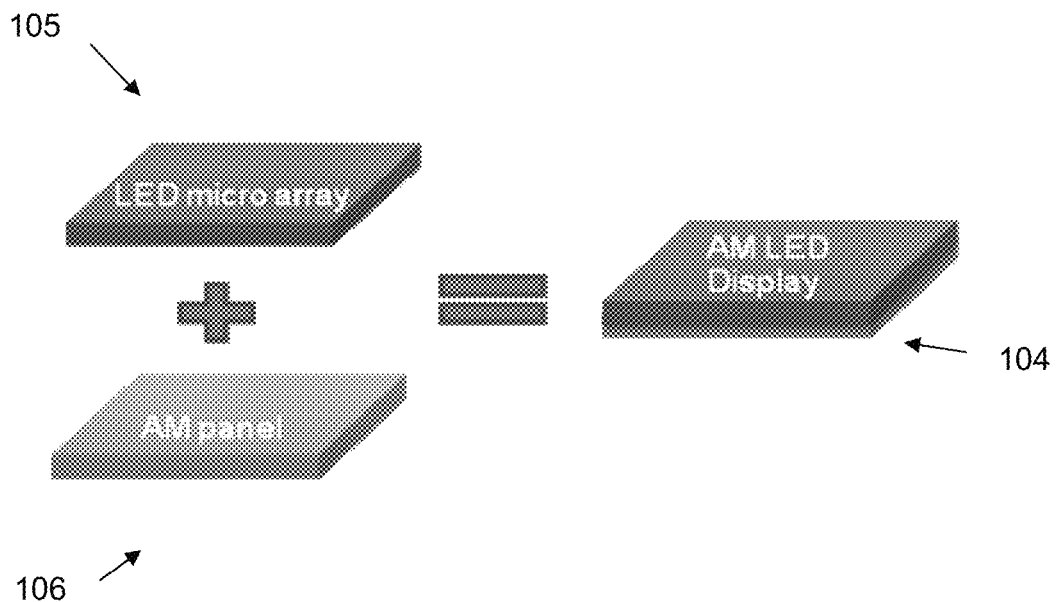
FIG. 3 is a schematic drawing showing a manufacture of an AM LED display according to the present subject matter by conductive bonding an LED micro-array panel with an AM panel.

FIG. 3 is a schematic drawing showing a manufacture of an AM LED display 104 according to the present subject matter by flip-chip bonding an LED micro-array panel 105 with an AM panel 106. The LED micro-array panel 105 may comprise a mold configured with a pattern of cells to locate phosphors having multiple colors, where the mold is made by material, such as sapphire, quartz, glass, single crystal silicon, and metal. The flip-chip bonding is a method for interconnecting semiconductor devices, such as Integrated Circuit (IC) chips and micro-electromechanical systems, to external circuitry with solder bumps that have been deposited onto the chip pads. The solder bumps are deposited on the chip pads on the top side of the wafer during the final wafer processing step. In order to mount the chip to external circuitry, it is flipped over so that its top side faces down, and aligned so that its pads align with matching pads on the external circuit, and then the solder is flowed to complete the interconnect. In this embodiment, a plurality of active control circuits mounted on the AM panel 104 are flipped over so that their top sides face down, and aligned and coherently adhered to bonding pads of corresponding LEDs mounted on the LED micro-array panel 105. This procedure will be described in more detail below with reference to FIG. 5.

Figure 4:
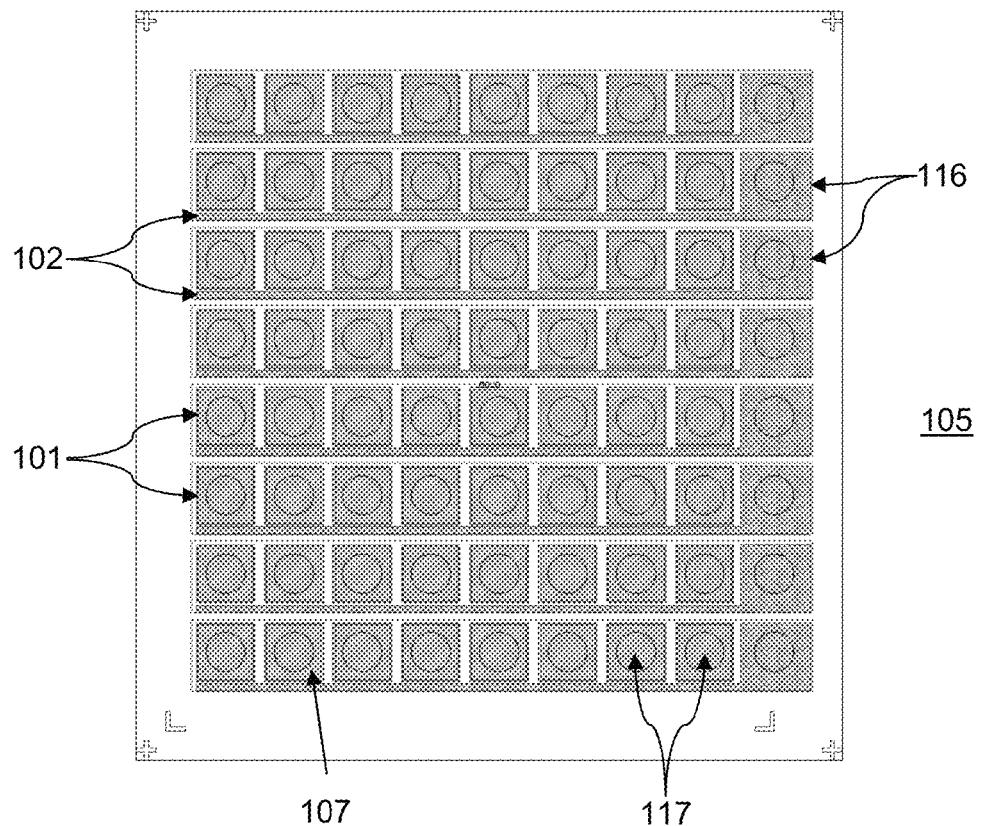
FIG. 4 schematically shows a layout of an 8×8 LED micro-array.

FIG. 4 schematically shows a layout of an 8×8 LED microarray 105, wherein individual LEDs 101 (emission wavelength 440 nm) on a same column are connected to one another by their n-electrodes (not shown) via a bus 102 at the end of each row as cathodes 116 while individual LEDs 101 on a same row are connected to an output of an AM panel through the solder bumps as anodes 117. In this configuration, the current passes through an n-GaN layer and an n-metal bus line to reach the n-electrodes. The LED micro-array 105 has similar electrical properties as a commercial 8×8 LED dot array. The LED microarray 105 has a display resolution of 8×8 and a display area with a diagonal length of 8 mm as a basic unit. The LED pixels 101 may have a pixel size equal to or more than 10×10 square micrometers in area or 10 micrometer in diameter. The resolution of the LED microdisplay panel may be 240×160 (HQVGA), 320×240 (QVGA), 640×480 (VGA), 800×480 (WVGA), 800×600 (SVGA), 1024×768 (XGA), 1440×900 (WXGA+), 1680×1050 (WSXGA+), or 1920×1200 (WUXGA), or higher display resolutions manufacturable by semiconductor processes. As shown by commercial discrete power LED manufacturing, flip-chip technology can improve heat dissipation, reliability, and manufacturability. A silicon substrate has a larger thermal conductivity (150 W/m·K) than a sapphire substrate (46 W/m·K), and well-developed flip-chip technology has been used with silicon for decades. In the epi-down (bottom-emitting) configuration, the p-electrode itself can be made reflective, thus eliminating any absorption of the current spreading layer and metal pads. In this way, the light output power and efficiency will be improved.

Figure 5:
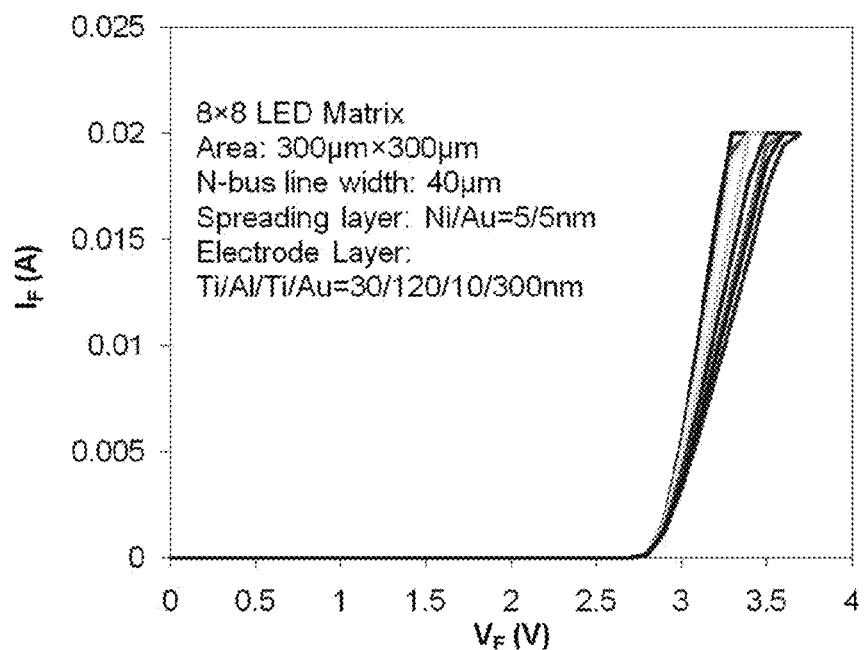
FIG. 5 is a graphical depiction showing a turn-on voltage distribution of eight LEDs in the same row.

FIG. 5 is a diagram showing a turn-on voltage distribution of eight LEDs in the same row. The turn-on voltages of LEDs, under the same 20 mA current injection, were strongly dependent on the distance between each LED and n-electrode. Series resistance of the bus bars to the n-GaN contact strip resulted in increased turn-on voltage with longer distance of dies from the contacts at the end of each column. For high-performance micro-displays, the variation of turn-on voltage might cause a different junction temperature and/or a compensation of piezoelectric field between the individual LED pixels, and hence, a variation in lifetime and emitting wavelength of the individual LEDs. The emission wavelengths may include red, green, blue, and ultraviolet (RGB, ultraviolet). The wavelength variation across the LEDs would result in a poor angular homogeneity of color purity. In this embodiment, the turn-on voltage uniformity was greatly improved in a design with 40 µm-wide one-side n-metal bus lines on each row. The turn-on voltages varied only from 3.30 to 3.70 V over the whole row under the same current injection, as shown in FIG. 5.

The RGB, ultraviolet permits the use of a red-green-blue-white display, in which the white is formed from an ultraviolet or blue diode with yellow phosphor. Other techniques can be used to generate white light, including the use of quantum dots. Alternate color combination is possible, according to selected primary colors, including red-yellow-green-blue, red-green-blue-green, red-yellow-blue-ultraviolet, etc.

The phosphors are applied to the mold in groups of four. Since there are typically 3 primary colors in a color display, three of the phosphors may be used to transmit in the selected three colors, and a fourth phosphor may be selected from a variety of options. In one configuration the phosphors transmit at least 3 primary transmission colors for respective ones of the pixels in each group. The phosphors applied to the fourth pixel in the group to transmit light which may be one of the three primary colors, white light, and a non-primary color (e.g. yellow) or a fourth primary color.

In one configuration, a mold is formed with number of cells for locating the red, green and blue phosphors onto the surface of the LEDoS display panel to obtain a full-color display. The mold is fabricated by etching holes through a single crystal silicon wafer to form mold cells. The red, green and blue color phosphors are mixed with silicone and then dropped into the mold cells. After hardening, the mold is aligned and mounted onto the surface of the LEDoS display panel. In an alternate configuration, a different material can be used to fabricate the mold, including polycrystalline silicon material or other material suitable for precision etching.

Figure 6:
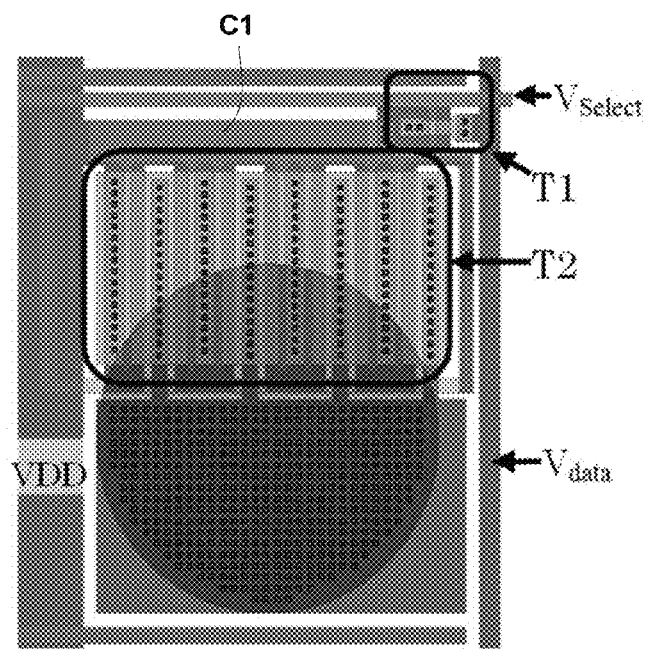
FIG. 6 schematically shows a configuration of driving circuitry on an AM panel.

FIG. 6 schematically shows a configuration of driving circuitry on an AM panel. Transistor T1 serves as a switching transistor and T2 serves as a driving transistor. When T1 is switched on by a scan signal, a data signal switches T2 on and is stored in the capacitor C1. Then, T2 provides current light up the LED pixel whose p-electrode is connected to the drain of T2. Driving transistor T2 is designed with a large W/L ratio to warrant enough output current for the LED pixel.

Figure 7:
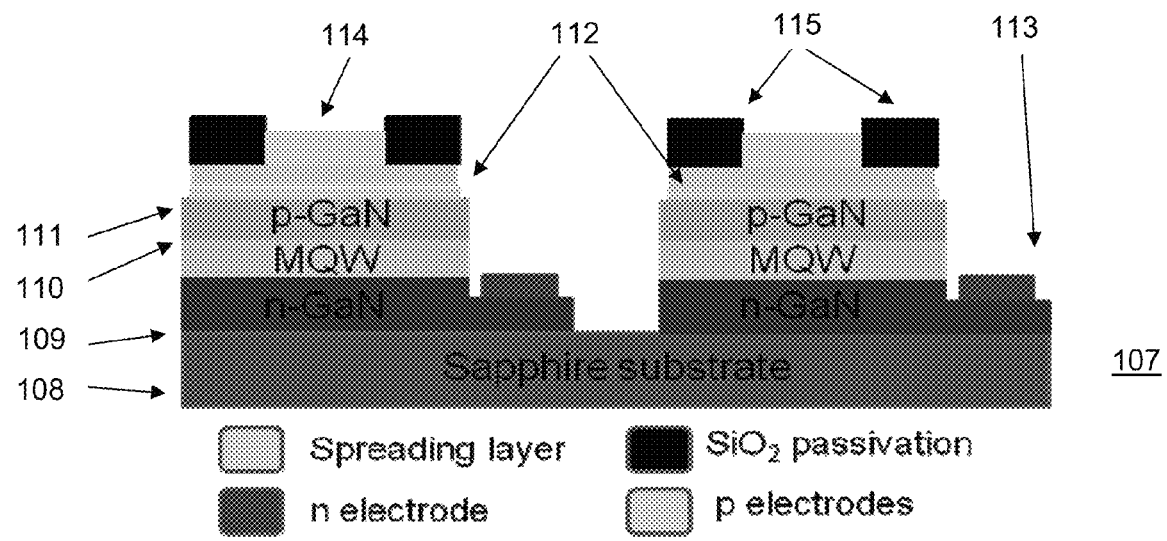
FIG. 7 is a diagram showing a cross-sectional diagram of two neighboring LED pixels in an LED micro-array as shown in FIG. 4.

FIG. 7 is a diagram showing a cross-sectional diagram of two neighbored LED pixels 107 shown in FIG. 4 in an LED micro-array. An n-GaN layer 109, a Multiple Quantum Well (MQW) 110, and a p-GaN layer 111 were grown on a substrate 108. Silicon dioxide ($SiO_2$) masks were used for inductively coupled plasma (ICP) etching. The LED wafer was etched all the way down to the substrate. Rows of the microarray were defined and isolated in this step. A Plasma-Enhanced Chemical Vapor Deposition (PECVD) $SiO_2$ mask and an ICP were used again to define the mesa structure of each LED pixel. A thin Ni/Au (5/5 nm) current spreading layer 112 was deposited onto the p-GaN layer 111 to form p-electrodes. Annealing in the atmospheric ambient at 570° C. for 5 minutes was performed. Then, a metal layer 113 was evaporated to form n-electrodes and a reflective layer on the p-electrodes simultaneously. Finally, Silicon dioxide passivation 114 was applied onto the wafer. Openings in the $SiO_2$ layers were defined for flip-chip bonding. The fabrication of an LEDoS micro-array display will be described in greater detail below.

First, fabrication of an LED micro-array panel is being described. A standard Multiple Quantum Well (MQW) blue LED wafer (emission wavelength 440 nm) grown on a sapphire substrate was used for fabrication of an LED microarray. In place of the sapphire substrate, GaAs, SiC, semi-insulating GaAs, or quartz substrate can be used. Plasma Enhanced Chemical Vapor Deposition (PECVD) grown $SiO_2$ masks were used for ICP etching. The LED wafer was etched all the way down to the sapphire substrate. Rows of the array were defined and isolated in this step. The PECVD $SiO_2$ mask and ICP were again used to define the mesa structure of each LED pixel, with individual device size of 300×300 µm$^2$. A thin Ni/Au (5/5 nm) current spreading layer was deposited onto a p-GaN surface by electron beam evaporation to form p-electrodes. Annealing at 570° C. in ambient atmosphere for 5 minutes was performed. In place of the thin Ni/Au current spreading layer, a thin Ag/ITO current spreading layer can be used. Then, a Ti/Al/Ti/Au (30/120/10/30 nm) multilayer metal was evaporated to form n-electrodes and a reflective layer on the p-electrodes simultaneously. Finally, $SiO_2$ passivation (or SiNx or photoresist) was applied onto the wafer. Openings in the $SiO_2$ were defined, and a Ni/Au (500/30 nm) contact pad was formed in the opening for flip-chip bonding. In the display, materials for the electrical insulation may comprise silicon dioxide, silicon nitride, and/or high-k materials.

Secondly, fabrication of an AM panel is being described. The AM panel was fabricated with standard Complementary Metal-Oxide Semiconductor (CMOS) process on a (100) single crystal silicon wafer. After cleaning, well regions and body connections were deposited and patterned. Field oxidation was performed to define the active area of the transistors using silicon nitride as a hard mask. Then, a thin layer of thermal oxide was grown as gate oxide. After poly-Si deposition and gate patterning, a source/drain region was formed by ion implantation with standard self-alignment technology. Then, low temperature oxide (LTO) was deposited, and the wafer was annealed to densify the LTO and to activate the implanted dopants simultaneously. After opening contact holes on the LTO layer, Al—Si alloy was deposited, and patterned for source/drain electrodes and interconnections. The silicon dioxide and silicon nitride is formed by thermal growth, low pressure chemical vapor deposition (LPCVD) or plasma enhanced chemical vapor (PECVD) deposition system. The high-k materials are formed by LPCVD, PECVD, MOCVD, MBE, or atomic layer deposition (ALD).

Figure 10:
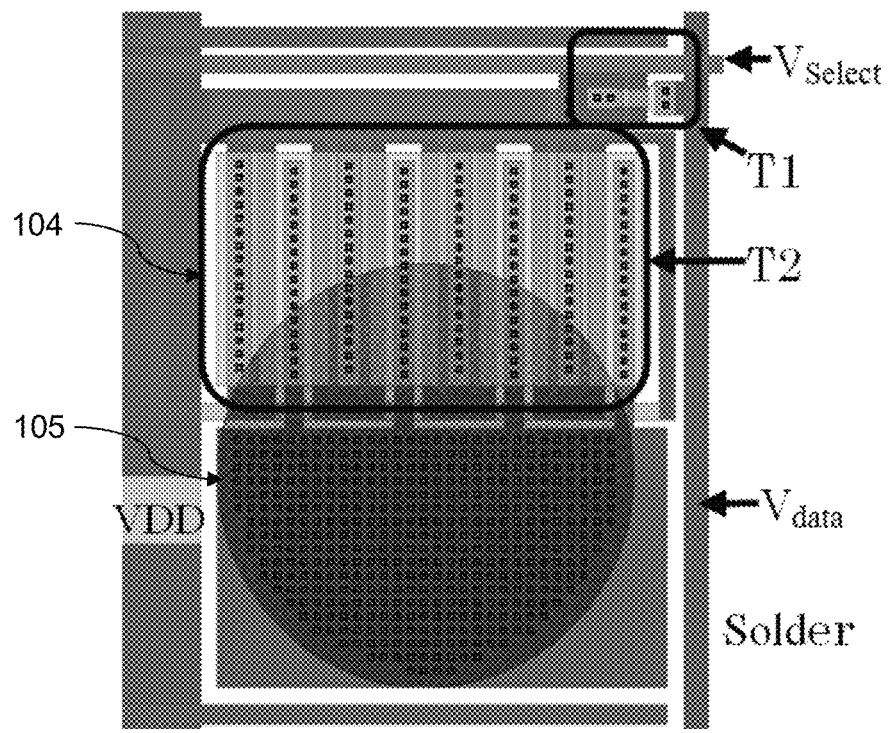
FIG. 10 is a microscopic scale image of an assembled AM LED micro-array panel.
Figure 13:
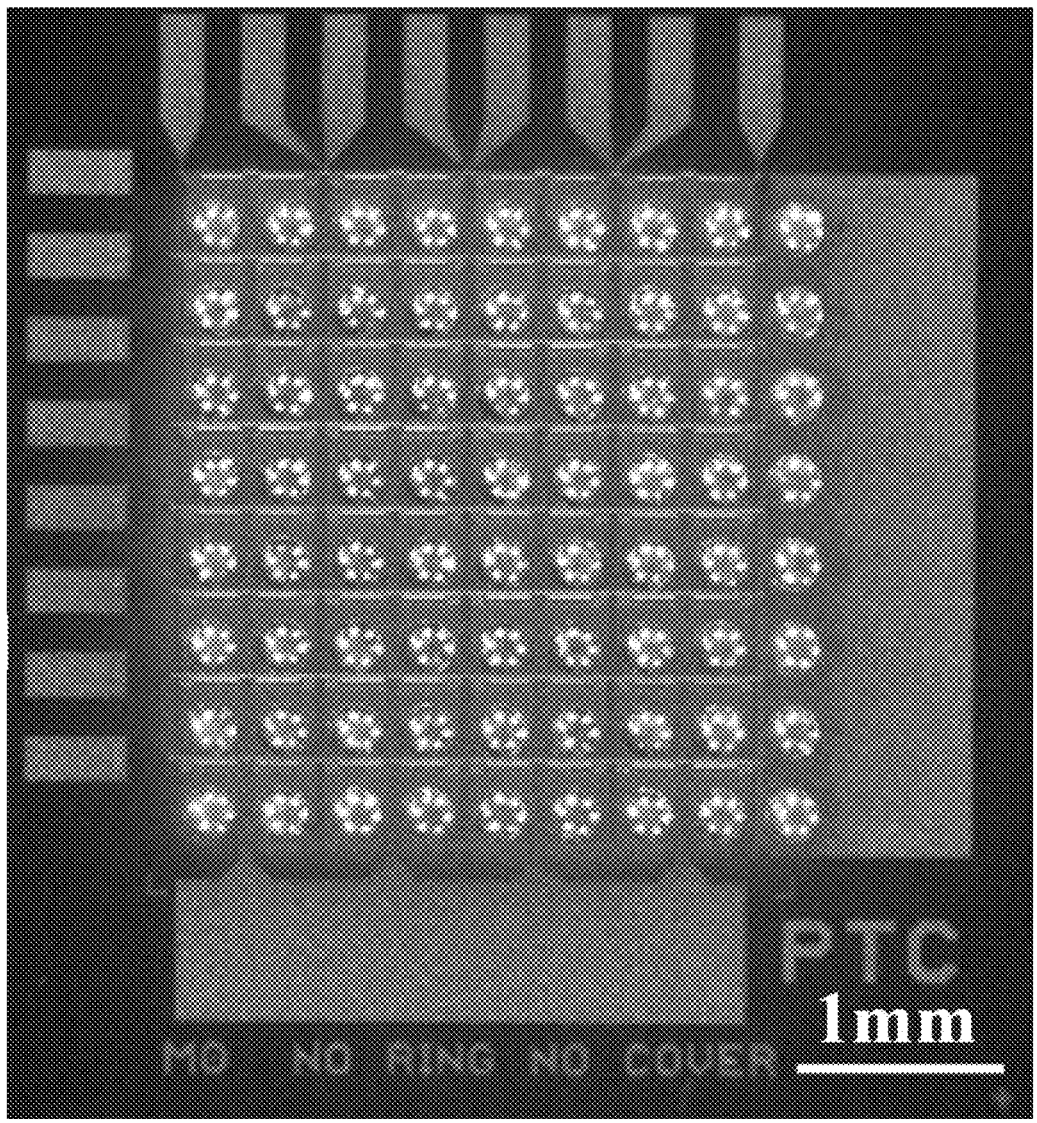
FIG. 13 is a photomicrograph showing solder bumps on a top of an AM panel.

Thirdly, a flip-chip process of the AM panel and the LED micro-array panel is being described. After the CMOS process, a layer of PECVD $SiO_2$ was deposited on the AM panel for passivation and holes were opened. A TiW/Cu (30/500 nm) seed layer was deposited by sputtering and photoresist AZ4903 was coated and patterned by photolithography. A thick Cu layer (8 μm) and solder layer (22 μm) were deposited by electrical plating. After reflow in the annealing furnace, excellent solder bumps were formed in a ball shape, as is shown in FIG. 13. The LED micro-array wafer was thinned and diced. After flipping the diced LED micro-array onto the AM panel, the device is completed as is shown in FIG. 10. The completed device was packaged in a dual in-line package (DIP) 40 socket and electrically connected by wire bonding. While the above is described only about CMOS process, it is noted that PMOS process or NMOS process is also can be used.

Figure 8:
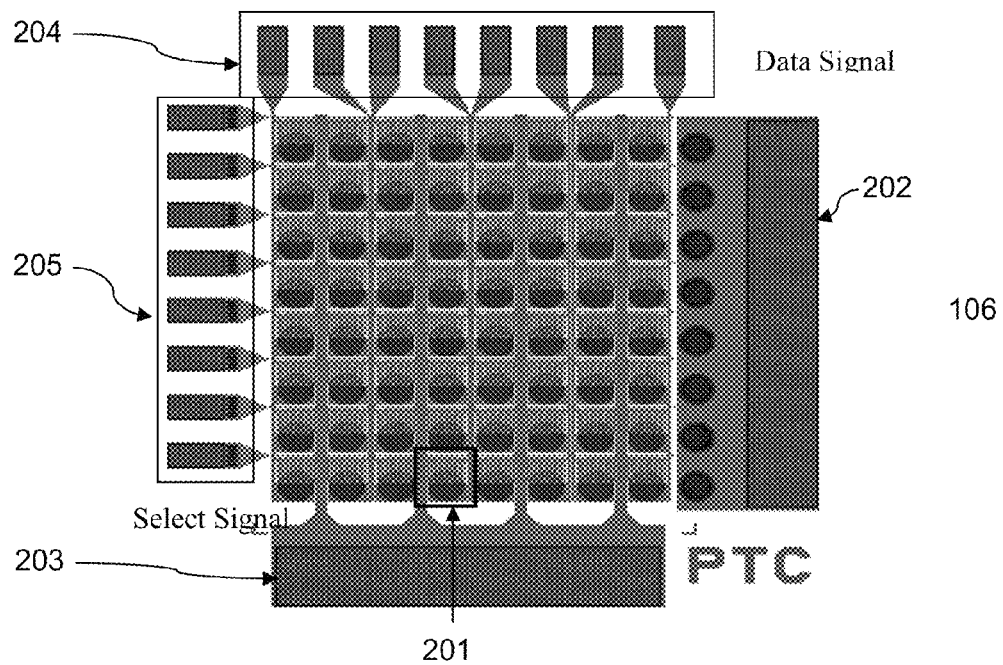
FIG. 8 is a diagram showing a configuration of 8×8 LED driving circuits on an AM panel.

FIG. 8 is a diagram showing a configuration of 8×8 LED driving circuits on an AM panel. The AM panel includes 8×8 pixel driving circuits 201, a power source VDD 202, a ground 203, and inputs for data signals 204 and inputs for select signals 205. The driving circuits 201 are selected from the group consisting of p-channel Metal Oxide Semiconductor (PMOS) transistors; n-channel Metal Oxide Semiconductors (NMOS) transistor; n-type amorphous silicon Thin Film Transistors (n-type a-Si TFTs); p-type amorphous silicon Thin Film Transistors (p-type a-Si TFTs); n-type poly crystalline silicon Thin Film Transistors (n-type p-Si TFTs); p-type poly crystalline silicon Thin Film Transistors (p-type p-Si TFTs); n-type SOI transistors; p-type SOI transistors; Zinc Oxide TFT; Copper oxide TFT; III-V materials TFT; n-channel high electron mobility transistor (n-HEMT); p-channel high electron mobility transistor (p-HEMT); n-channel metal-oxide-semiconductor high electron mobility transistor (n-MOSHEMT); and/or p-channel metal-oxide-semiconductor high electron mobility transistor (p-MOSHEMT).

Figure 9:
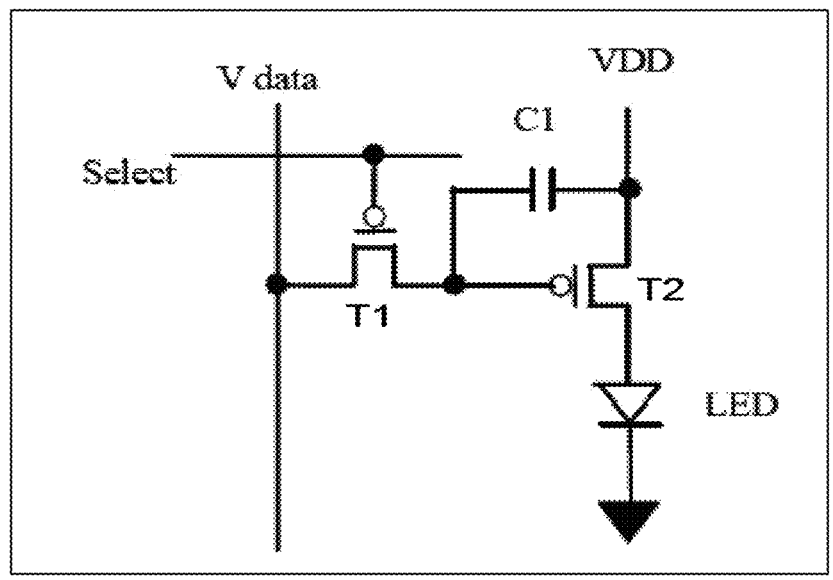
FIG. 9 is a schematic diagram of a pixel driving circuit.

FIG. 9 is a schematic diagram of a pixel driving circuit. Transistor T1 serves as a switching transistor and transistor T2 serves as a driving transistor. When transistor T1 is switched on by a scan signal, a data signal switches transistor T2 on and is stored in capacitor C1. Then, transistor T2 provides current to turn on the LED pixel whose p-electrode is connected to the drain of transistor T2. Driving transistor T2 is designed with a large W/L ratio to warrant enough current for the LED pixel.

FIG. 10 is a microscopic-scale image of an assembled LEDoS micro-array panel. The LED micro-array 104 is thinned and polished, and then flipped on an AM panel 105. Light is emitted from the backside of the substrate. It is found that the aspect ratio of the LEDoS micro-array could be as high as 100%, profiting from bottom emitting configuration.

Figure 11:
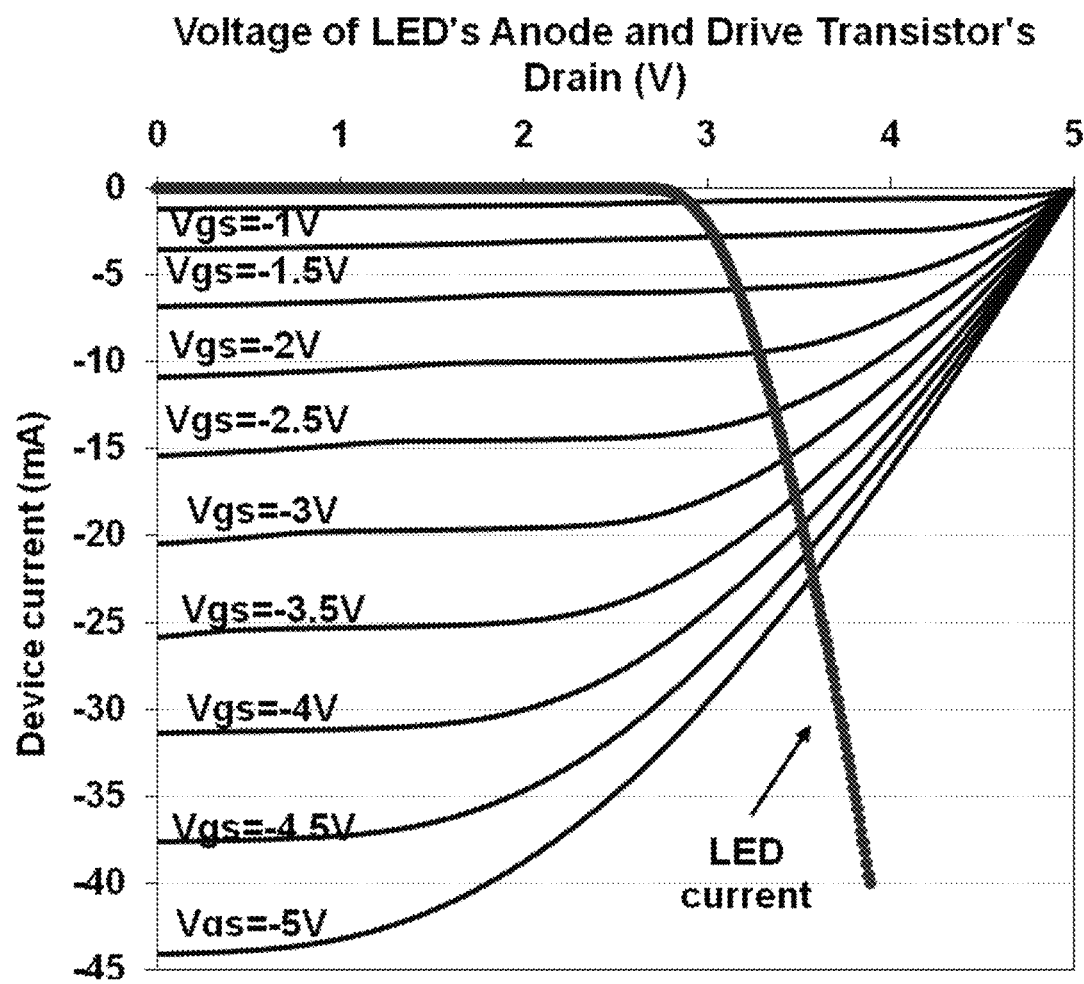
FIG. 11 is a graphical diagram showing a typical current-voltage (I-V) characteristic of an individual pixel in an AM LED micro-array panel.

FIG. 11 is a diagram showing a typical current-voltage (I-V) characteristic of an individual pixel in an LEDoS micro-array panel. Since the LED and the driving transistor are connected in series, the operating points are determined by the power supply voltage as well as the current-voltage characteristics of the LED and the driving transistor. From the I-V curve, it is shown that the AM panel has sufficient driving capability for the LED micro-array.

Figure 12A:
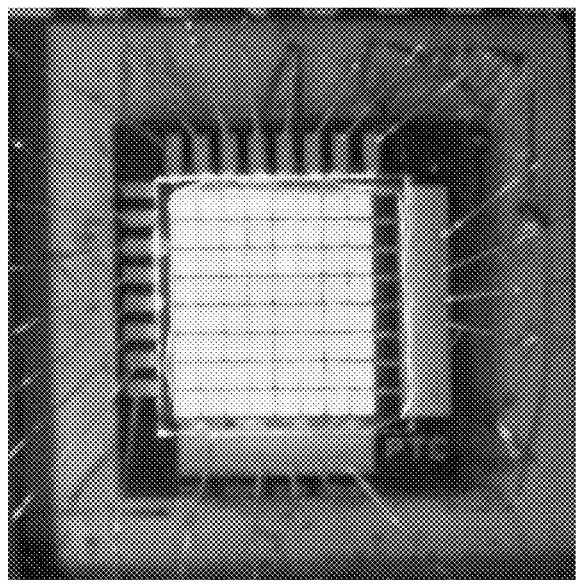
FIGS. 12A and B are photomicrographs respectively showing fully turned-on and individually turned-on images of an AM LED micro-array panel.
Figure 12B:
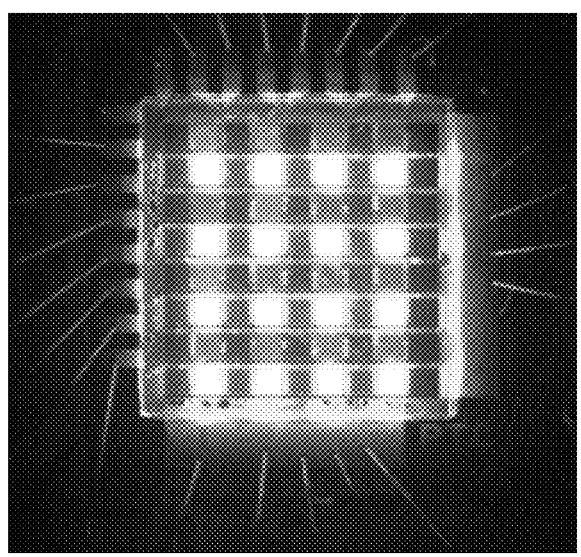

FIG. 12A and B respectively show fully turned-on and individually turned-on images of an LEDoS micro-array panel. The LED pixels have high brightness, good luminance uniformity and individual controllability by the AM panel. FIG. 13 is a diagram showing an AM panel on which a plurality of solder bumps are attached in rows and columns. The pixel size of this example was 500 μm×500 μm in a square shape. The space between neighbor pixels varied with 50 μm, 100 μm and 200 μm, respectively. One single pixel could be taken as an individual pixel for a monochromatic LEDoS display. The four pixels in the neighboring rows and columns could be taken as a full-color pixel of a full-color LEDoS display.

The n-GaN layer among rows of the LED array was etched completely to produce a good isolation for LED pixels. For passive matrix driving scheme, the isolation is necessary to prevent electrical shortage because the voltages applied on different rows were not the same.

Figure 14:
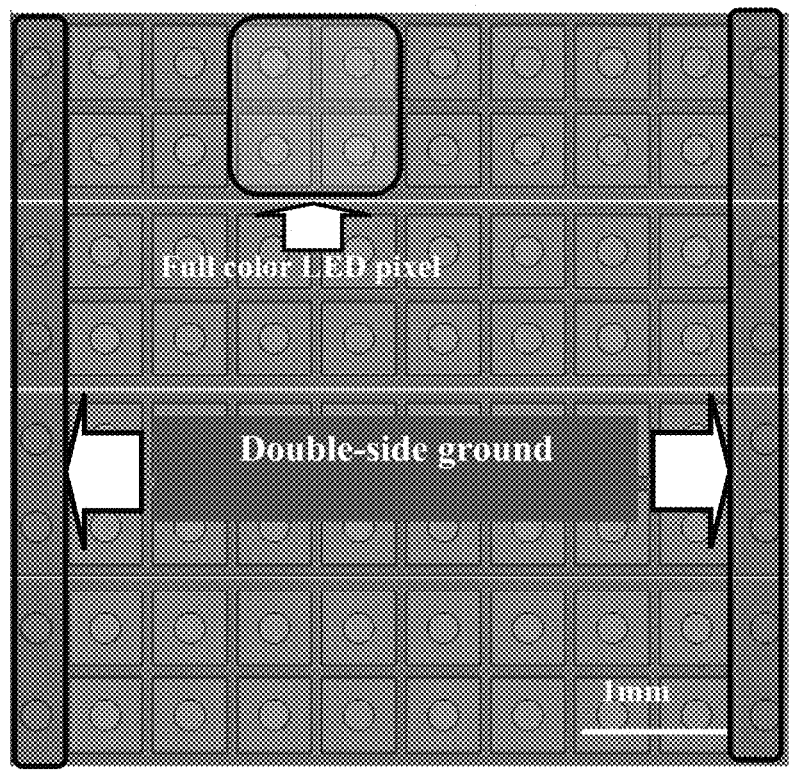
FIG. 14 is a diagram showing a layout structure of the 8×8 monochromatic LED micro-array module.
Figure 24:
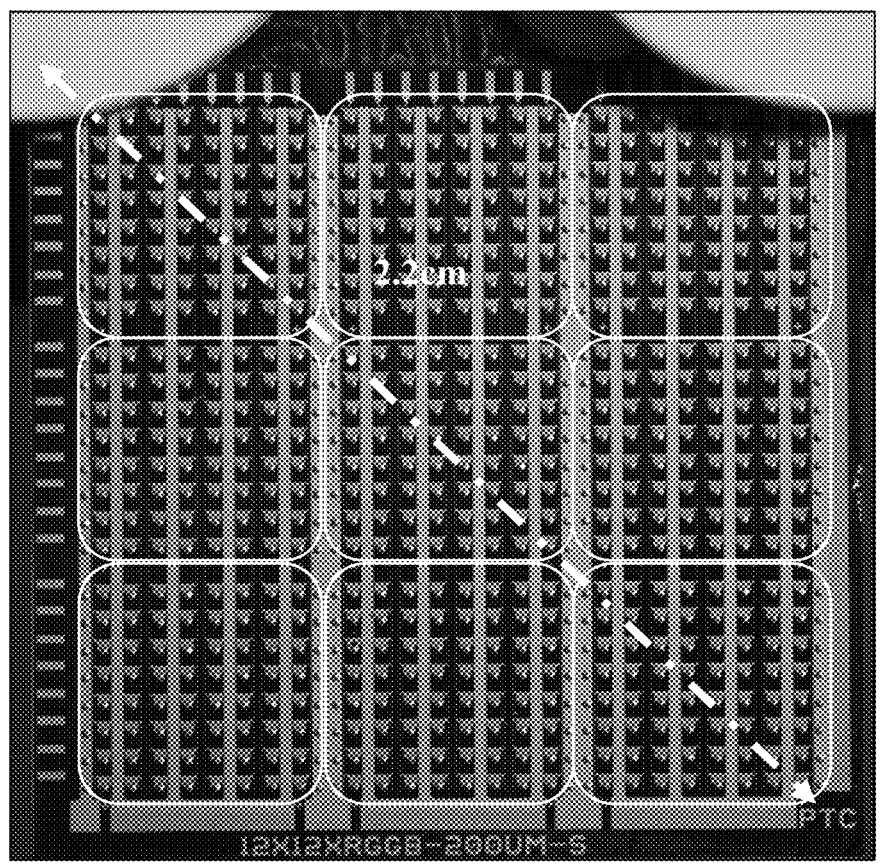
FIG. 24 is a photomicrograph showing scaling-up of an active matrix substrate.

FIG. 14 is a diagram showing a layout structure of the 8×8 monochromatic LED micro-array module. 4 monolithic LED pixels can be combined together and form one full-color LED pixel. Ground electrode located at both side of the module to get better device uniformity. The 8×8 LED micro-array was designed as a module for large area LED micro-array. The dimension of the module was 5.05 mm×4.88 mm. Different number of modules which were integrated on a large active matrix substrate will be discussed in the following sections. The cross-sectional view of two LED pixels and the three-dimensional view of the 8×8 LED micro-array module are shown in FIG. 24.

The 8×8 LED micro-array module can serve as a monochromatic display with resolution of 8×8. Also it can serve as a full-color display with resolution of 4×4. The resolution decreases because four sub-pixels are needed to form a color pixel in full-color display. FIG. 14 is a diagram showing the detailed configuration of this concept.

Figure 15:
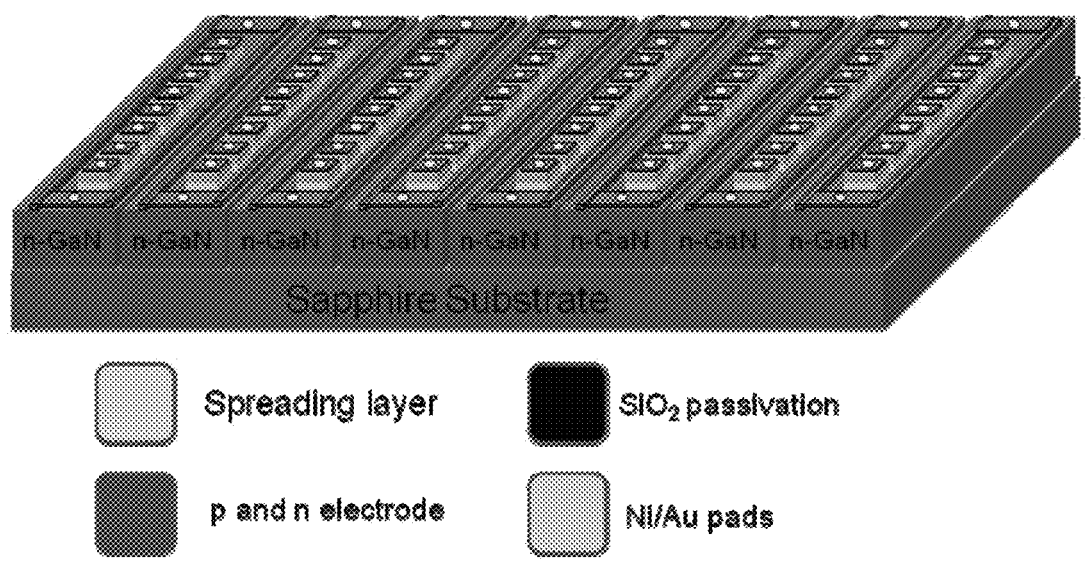
FIG. 15 is a diagram showing a perspective view of the 8×8 monochromatic LED micro-array module.

FIG. 15 is a diagram showing a perspective view of the 8×8 monochromatic LED micro-array module. The individual pixels may be constructed as shown in FIG. 7.

FIG. 16 are microscopic scale diagrams showing four types of design with different bus line configuration. FIG. 16A shows a design without any optimization; FIG. 16B shows design with 40 μm-wide n-metal line; FIG. 16C shows a design with n-metal surrounding; FIG. 16D shows a design with n-metal surrounding and double-side ground.

Figure 16A:
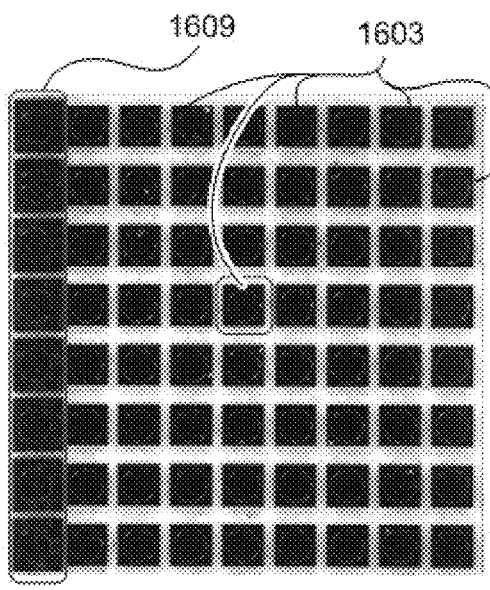
FIG. 16A shows a design without any optimization.
Figure 16B:
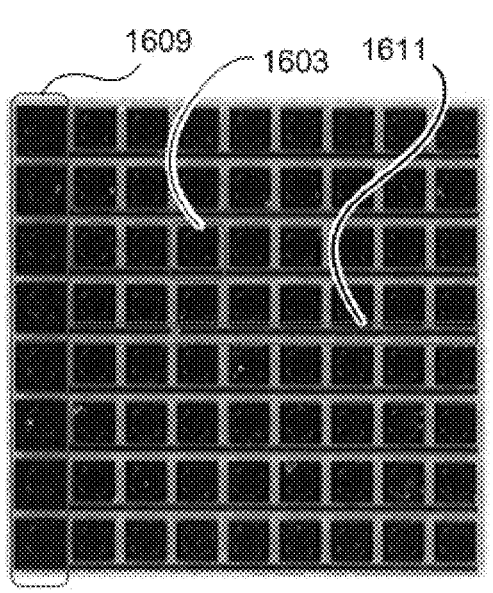
FIG. 16B shows design with 40 μm-wide n-metal line.
Figure 16C:
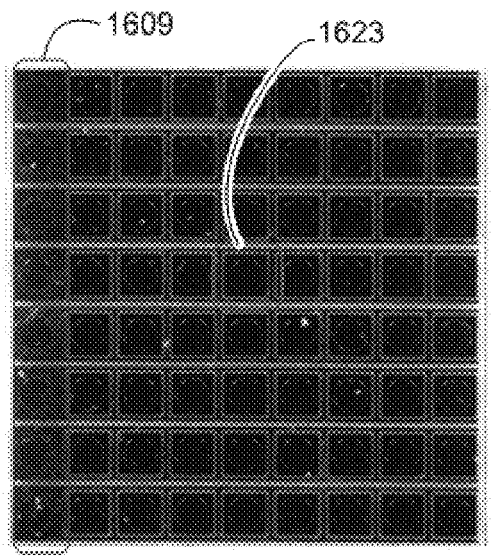
FIG. 16C shows a design with n-metal surrounding.
Figure 16D:
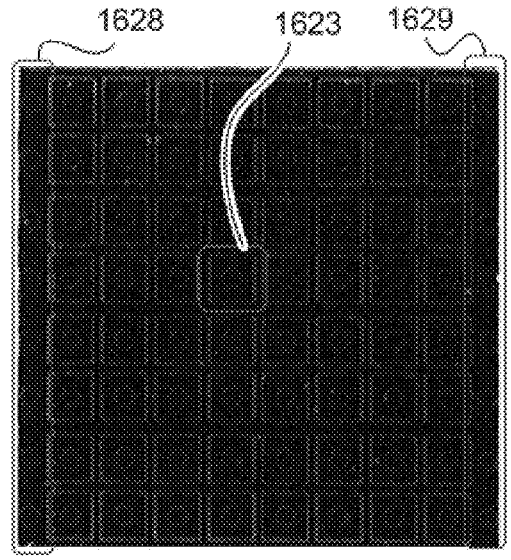
FIG. 16D shows a design with n-metal surrounding and double-side ground.

FIG. 16A is a diagram showing an LED micro-array panel designed without any optimization; FIG. 16B is a diagram showing an LED micro-array provided with 40 μm-wide n-metal line; FIG. 16C is a diagram showing an LED micro-array provided with n-metal surrounding; and FIG. 16D is a diagram showing an LED micro-array provided with n-metal surrounding and double-side cathodes. In FIGS. 16A-16D, 8×8 LED pixels are used as a basic module for a large-scale LED micro-array with four different types of design. The n electrodes of each row are placed at two sides of the LED micro-array, and both of the two n electrode columns are connected to the cathode terminals of the silicon-based substrate in the final prototype. The p electrode of each LED pixel is independent and connected to a corresponding anode (solder bump) on the silicon-based substrate. In FIG. 16A, 8×8 LED pixels formed in an array designed without any optimization. In FIG. 16B, a 40 μm-wide n-metal line is designed as an extension of a common cathode for each row. In FIG. 16C, an n-metal line is designed to surround each LED pixel. In FIG. 16D, double-side cathodes are used as well as n-metal surrounding. The designs shown in FIGS. 16A-16C are for comparison on the forward voltage variations.

The relationship between uniformity of forward voltage and design of n-bus line were investigated. One implementation includes a new double-side ground configuration to improve the uniformity of the forward voltage of the LED pixels as shown in FIG. 14 and FIG. 16D. The common n-electrode of each row was designed at two sides of the LED micro-array and both n-electrode columns were connected to ground terminal on active matrix substrate in the final product. The other three designs were fabricated also for reference. The n-electrodes of each row were placed at two sides of the LED micro-array, and both of the two n-electrode columns were connected to ground terminals on active matrix substrate in the final prototype. The p-electrode of each LED pixel was independent and was connected to a corresponding anode (solder bump) on the active matrix substrate. Four types of design are shown in FIG. 16. In design (a), 8×8 LED pixels formed an array without any optimization design. In design (b), a 40 μm-wide n-metal line was designed as an extension of common n-electrode for each row. In design (c), the n-metal line was designed surrounding each LED pixel. In design (d), double-side ground were used as well as n-metal surrounding. Design (a), (b) and (c) were fabricated for comparison on the forward voltage variations. With the n-metal surrounding and double-side ground designs, the resistance of each LED pixel decreased and better forward voltage uniformity was realized.

In the design shown in FIG. 16D, both n-metal surrounding and double-side cathodes are used. The variation of the forward voltage of 8 LEDs is significantly reduced to 0.02V. FIG. 16B is a diagram showing the current-voltage (I-V) characteristics of the LED micro-array module with the design according to FIG. 16D. 24 LED pixels located at different spots on a 2-inch wafer are measured. The forward voltages of the pixels exhibit good uniformity with a variation smaller than 0.06V. This clearly demonstrates the feasibility of achieving high-resolution and large-scale LED micro-arrays with excellent forward voltage uniformity. In the design shown in FIG. 16D, the variation on the distance from an n electrode to a p electrode of each LED pixel is significantly reduced by the n-metal surrounding and the double-side cathodes, leading to uniform device resistance and forward voltages of the LED pixels.

Figure 17:
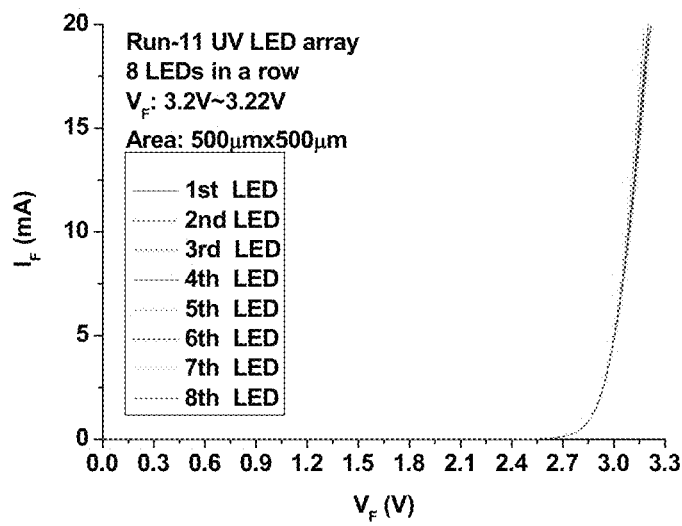
FIG. 17 is a graphical diagram showing a forward voltage variation of 8 LEDs in the configuration of FIG. 3.
Figure 18:
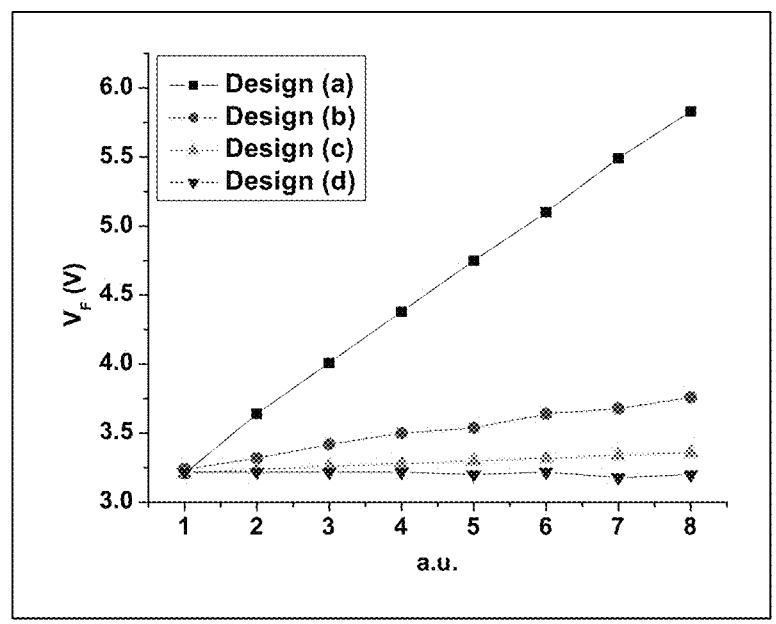
FIG. 18 is a graphical diagram showing a comparison among forward voltage variation of four types of bus-line configurations of FIG. 3.

FIG. 17 is a graphical diagram showing a forward voltage variation of 8 LEDs in the configuration of FIG. 3. The variation is 0.6% (0.02V/3.2V). Current-voltage (I-V) characteristics of 8 LEDs in the same row of four types of designs were measured. With the double-side ground design, the forward voltage variation of 8 LED pixels in the same row was 0.02V as shown in FIG. 17. Comparison results of forward voltage variation are shown in FIG. 18. The variation of the initial design was 81.9% (2.62V/3.2V). With the 40 μm-wide n-metal line, the variation was decreased to 16.2% (0.52V/3.2V). With n-metal surrounding design, the variation was further decreased to 4.7% (0.15V/3.2). In design (d), both n-metal surrounding and double-side cathodes were used. The variation of the forward voltage of 8 LEDs was significantly reduced to 0.6% (0.02V/3.2V).

24 LED pixels with design (d) located at different spots of a 2-inch wafer were measured. Their forward voltages exhibited good uniformity with variation smaller than 1.8% (0.06V/3.2V) as shown in FIG. 19. It clearly demonstrates the feasibility of achieving high-resolution and large-scale LED micro-arrays with excellent forward voltage uniformity. In design (d), the variation on the distance from the n electrode to the p electrode of each LED pixel was significantly reduced by the n-metal surrounding and the double-side cathodes, leading to uniform device resistance and forward voltages of LED pixels.

FIG. 18 is a diagram showing forward voltage VF variation of 8 LEDs in the same row of the four deferent designs shown in FIG. 16A to FIG. 16D. Among these four designs, the VF of design according to FIG. 16D exhibits excellent uniformity with the variation smaller than 0.02V, and has the best improvement in device uniformity.

FIG. 19 is a graphical diagram showing an array of 24 LED pixels of design (d) of FIG. 3 randomly measured across a 2-inch wafer. FIG. 19 shows an I-V curve of the 24 LEDs located at different spots on a 2-inch wafer. The forward voltage variation is 1.8% (0.06V/3.2V). The VF variation is measured of 0.06V. The forward voltage variation is shown in FIG. 16A. The variation of the forward voltage in the initial design is 2.62V. With a 40 μm-wide n-metal line, the variation is decreased to 0.52V. With an n-metal surrounding design, the variation is further decreased to 0.1523V.

FIGS. 20A and B are diagrams showing utilization rates of a 2-inch LED wafer. In FIG. 20A, only one LED array with 22 mm in diagonal is obtained. The utilization rate is 0.24. In FIG. 20B, 32 LED arrays with 5 mm in diagonal can be obtained. The utilization rate is 0.40, a significant improvement.

At present, 2-inch sapphire and SiC wafers are commonly used for epitaxial growth of III-nitride based LEDs. The utilization rate of wafer area would be lower in the case of LED micro-arrays with relative large dimensions (typically several millimeters in diagonal). As can be seen in FIG. 20A, only one die with diagonal of 22 mm can be fabricated on a 2-inch wafer, and the utilization rate is 0.24. Referring to FIG. 20B, the die number will increase to more than 32 if the die size shrinks with diagonal of 5 mm and the utilization rate increases to 0.40. The size limitation of sapphire and SiC substrates also provides a challenge for the development of potential scaling-up LED micro-array applications. Therefore it is necessary to make small LED micro-arrays as standard modules which can be easily integrated together to achieve a large-scale LED array panel. The yield of the LED pixels is increased simultaneously by the method of basic LED micro-array module.

Pixel circuits of active matrix substrate were produced, in which the driving transistors had square active island area and the solder bumps for flip-chip process seated on part of the device area. Although around 1 μm thick $SiO_2$ was used as passivation, shortage could not be avoided completely due to high defect density of the passivation layer deposited by PECVD system. The other consideration was during the flip-chip process, mechanical pressure should be applied on the LED micro-array after alignment with the active matrix substrate to ensure good adhesion. This stress would be applied on driving transistor directly through solder bump and would bring some destructive effects on the transistor.

Figure 21:
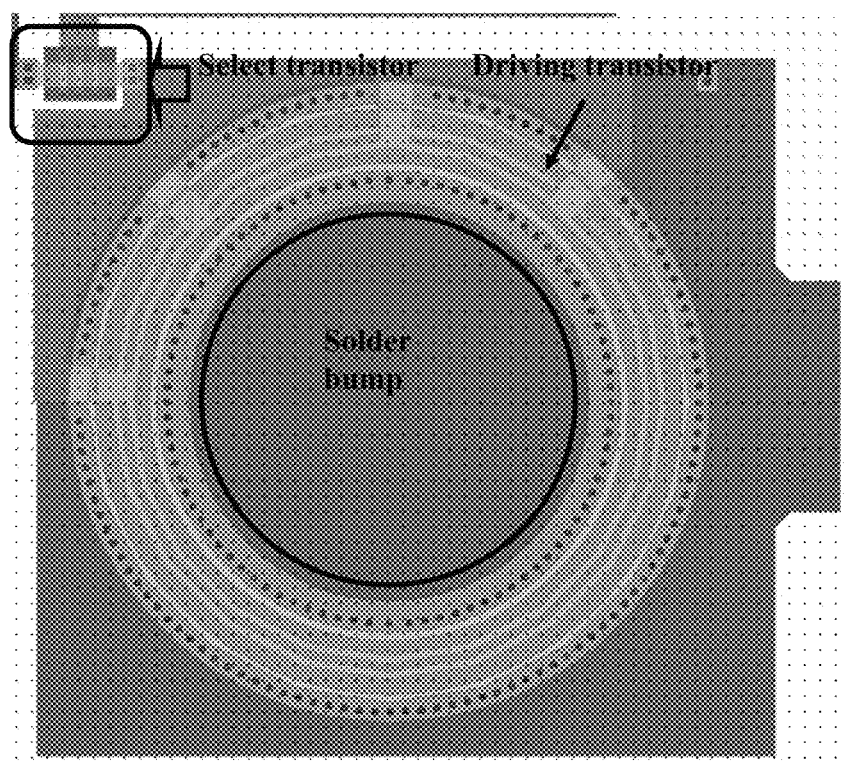
FIG. 21 is a diagram showing a layout structure of pixel circuit on the active matrix substrate.

In order to avoid these two problems, a circular shape driving transistor was designed in second generation layout as shown in FIG. 21. FIG. 21 is a diagram showing a layout structure of pixel circuit on the active matrix substrate. The driving transistor was designed in circular shape with solder bump area located in the center. This structure can provide better electrical uniformity and better mechanical reliability. A double gate structure was designed to reduce the off-status leakage current. Each ring-shape gate has width of 5 μm. The effective W/L of the driving transistor was equal to 1080 μm/10 μm. The drain electrode of the driving transistor was designed in a circular shape and the solder bump was located in the middle of the circular area and was far away from active channel of PMOS transistor. Electrical shortage and mechanical stress issues were solved in this design. Since the function of the select transistor is only to switch the pixel "on" and "off", no large current passed through the channel of the select transistor. Tri-gate structure was designed to reduce the off-status leakage current.

Figure 22:
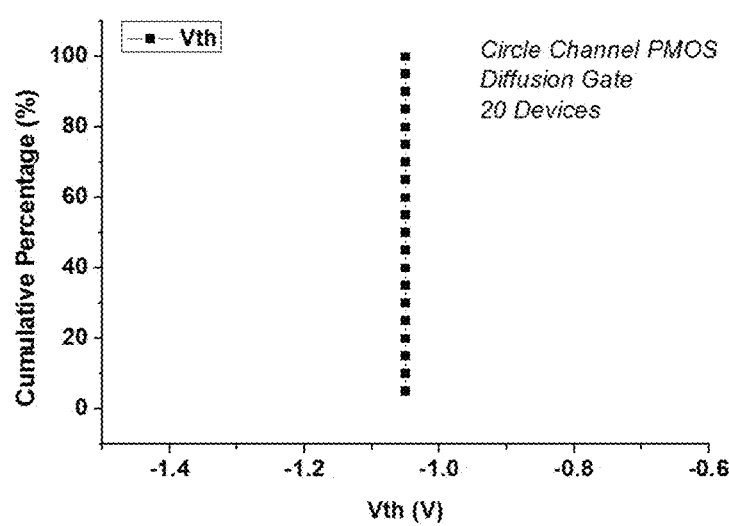
FIG. 22 is a graphical diagram showing uniformity of PMOS transistors of the pixel circuits on active matrix substrate.

FIG. 22 is a graphical diagram showing uniformity of pmos transistors of the pixel circuits on active matrix substrate. 20 pmos transistors were randomly measured across a 4-inch wafer. The devices exhibit excellent uniformity. The 20 diffusion gate PMOS devices were randomly selected on a 4-inch wafer and measured. The results shown in FIG. 22 is a diagram showing the PMOS devices have excellent uniformity.

As mentioned above, 2-inch sapphire and SiC wafers are widely used for LED growth. The size limitation of substrates provides a challenge for the development of large scale LED micro-array. LEDs grown on single crystal silicon wafer are under research all over the world. But so far there are only few commercial products in the market. For LED micro-array integrated by using flip-chip technology, the best resolution to realize large scale display panel is integrating standard LED micro-array modules on a full-custom silicon substrate which can be as large as 12 inches.

To scale-up the LEDoS displays, the active matrix substrate was designed with new structures. Structure 1 has four zones, each zone includes 8×8 pixel circuits. Structure 2 has 9 zones, each zone includes 8×8 pixel circuits. Each zone was corresponding to a LED micro-array module. Then the LED micro-array modules were integrated on the active matrix substrate by the flip-chip process. Special attention should be paid when aligning the modules and the substrate. 4 LED micro-array modules were integrated onto structure 1 to realize a 16×16 monochromatic display panel or an 8×8 full color display panel with a diagonal of 1.7 cm; 9 LED micro-array modules were integrated on structure 2 to realize a 24×24 monochromatic display panel or a 12×12 full color display panel with a diagonal of 2.2 cm.

FIG. 23 is a chart showing four different combinations of the full-color pixels. Since different phosphors can be used, the arrangement is not limited to the different combinations shown in FIG. 23. Also, the relative placements of the different phosphors can be arranged as desired.

There are several methods to realize a full-color LED display. The first method, also the easiest method, is assembling discrete commercial LEDs to form an array. Each LED pixel includes three individual red, green and blue LED lamps. The outdoor LED large-screens are using this method. It was known that the LED displays fabricated in this method have disadvantages such as low resolution, large bulk and weight.

The second method is producing white light first and then obtaining red, green and blue light through individual color filters. There are two major concepts for the generation of white light: mixing the light emitted from monochromatic LEDs such as red-green-blue LEDs; and the color conversion approach, in which color phosphors are placed on an ultra-violet (UV) LED or a blue LED and exited by the UV light or blue light coming for the LEDs. The later approach is the most common one for white light generation; however the light loss will occur twice in this method. The first loss is due to the conversion of white phosphors and the second loss is due to the color filters.

A third method is placing red, green and blue phosphors on individual pixels of a single color LED micro-array, typically an ultraviolet LED micro-array. Each pixel excites one special color phosphors and neighbored red, green and blue pixels forming a full-color pixel. In this method, only one time color conversion is necessary. So the power loss is less than that in the second method.

Each full color LED pixel included 4 sub-pixels which could be arranged in four combinations: RRGB, RGGB, RGBB or even WRGB. The detailed information of these four combinations is shown in FIG. 23. The schematics of a full-color LED pixel with different combinations are shown in FIG. 23. The RGB colors were obtained by special phosphors excited by 385 nm UV LED micro-arrays. The dimension of each LED sub-pixels is 500 μm×500 μm with different space between neighbor LED devices.

FIG. 24 is a photomicrograph showing scaling-up of an active matrix substrate in 2.2 cm diagonal. The diagram shows a 24×24 monochromatic active matrix substrate with solder bumps on each pixel circuit with the diagonal of 2.2 cm. In FIG. 24, in addition to the design of an LED micro-array panel, a scaled-up silicon-based substrate is also designed. The silicon substrate is composed of 4-zone and 9-zone areas. Each zone corresponds to a standard LED micro-array module. By integrating a 4 or 9 LED micro-array modules on the substrate through the flip-chip process, a 16×16 panel with 1.7 cm in diagonal or a 24×24 panel with 2.2 cm in diagonal is fabricated.

The depiction of FIG. 24 details scale-up designs. This large-scale active matrix substrate includes nine 8×8 zones each is corresponding to one 8×8 LED micro-array module mentioned in FIG. 1.

Figure 25:
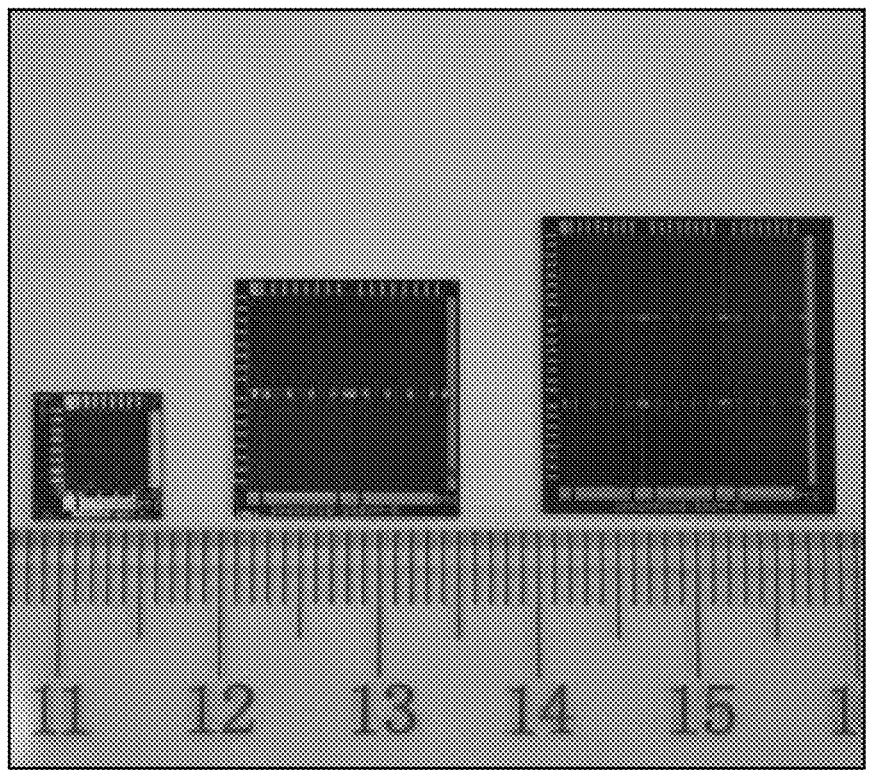
FIG. 25 is an image of three large-scale LEDoS displays with one, four and nine zones.

FIG. 25 is a photographic image showing three different LED microarray modules provided with one, four and nine LEDs integrated on silicon-based substrates, respectively. From left to right, an 8×8 single LED module, a 16×16 panel with 1.7 cm in diagonal, and a 24×24 panel with 2.2 cm in diagonal are displayed. The LED micro-array designed according to this embodiment provides a promising method for LED array binning, and also improves the utilization rate of the LED wafers greatly. The dimension can be scaled-up to larger than 300 mm according to the availability of single crystal silicon wafer on the market. The scaling-up hierarchy of the large-scale LEDoS display is shown in Table 1:

TABLE 1

The scaling-up hierarchy of the large-scale LEDoS dispaly

| structure | Zone Number | Resolution in monochromatic | Resolution in full-color | diagonal |
|---|---|---|---|---|
| 1 | 1 zone | 8 × 8 | 4 × 4 | 0.8 cm |
| 2 | 4 zones | 16 × 16 | 8 × 8 | 1.7 cm |
| 3 | 9 zones | 24 × 24 | 12 × 12 | 2.2 cm |
| . | . | . | . | . |
| . | . | . | . | . |
| . | . | . | . | . |

In this disclosure, red, green and blue phosphors were used to obtain a full-color display. UV LED micro-array with wavelength of 385 nm served as excitation source.

Figure 26A:
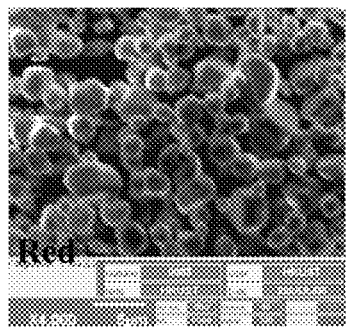
FIGS. 26A-C are SEM images of three types of phosphors.
Figure 26B:
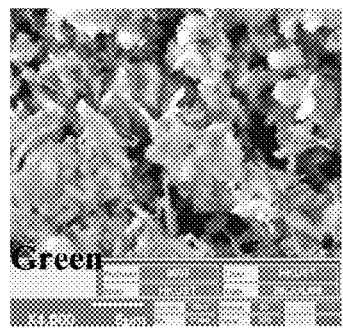
Figure 26C:
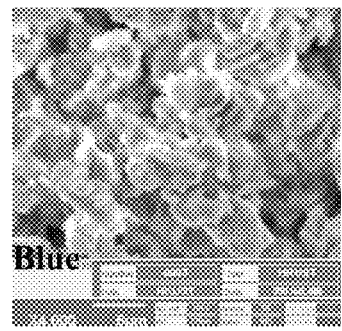
Figure 27A:
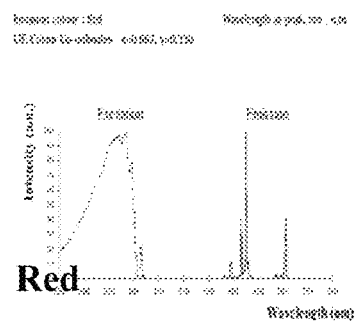
FIGS. 27A-C are graphical diagram showing excitation and emission light of the red, green and blue phosphors depicted in FIGS. 26A-C, respectively.
Figure 27B:
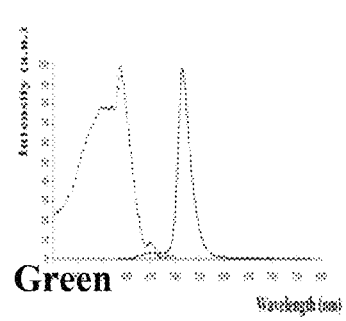
Figure 27C:
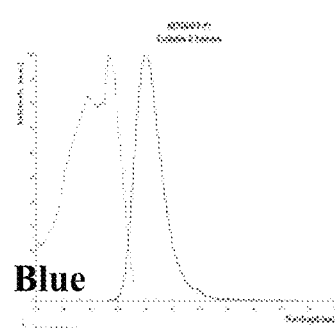
Figure 28A:
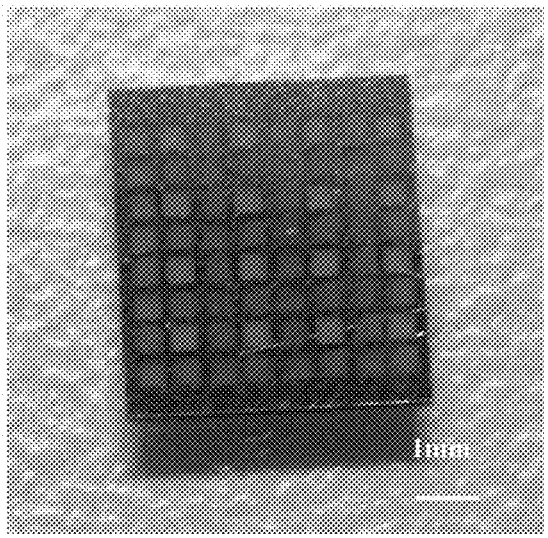
FIGS. 28A and B are photomicrographs depicting a silicon mold fabricated for dropping phosphors with different emission wavelength on the panel of LEDoS displays.
Figure 28B:
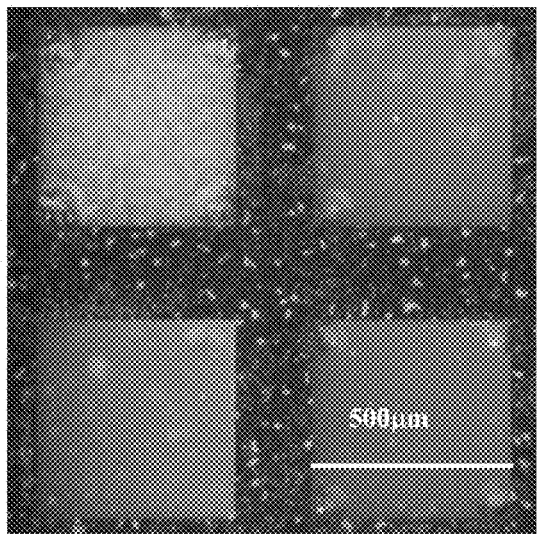
FIG. 28B shows details of the silicon mold of FIG. 28A.

FIGS. 26A-C is SEM images of three types of phosphors. FIGS. 28A and B are photomicrographs depicting a silicon mold fabricated for dropping phosphors with different emission wavelength on the panel of LEDoS displays. FIG. 28B shows details of the silicon mold of FIG. 28A. FIGS. 27A-C are graphical diagram showing excitation and emission light of the red, green and blue phosphors depicted in FIGS. 26A-C, and show the excitation-emission relationship of these three types of phosphors, respectively. The particle sizes of the phosphors shown in the SEM pictures of FIGS. 26A-C range from 1 μm to around 5 μm. The particle size, concentration and thickness of phosphors have effects on the light output and conversion efficiency, which is studied in many publications. Since the particles of phosphors were large and the display panel was too fragile to stand extra photolithography process, it was difficult to selectively coat the phosphors on the display panel by photolithography. A gas pressure controlled dispenser was employed to drop the phosphors with individual positions and individual kind of phosphors. The phosphors were mixed with transparent silicone with a mass ratio of 1:10 first. Then three kinds of mixtures were filled into different needles. After that the dispenser dropped the mixture onto a silicon mold prepared in advance. Finally the silicon mold was baked at 230° C. for 1 hour to harden the mixture of silicone and phosphors.

Figure 29:
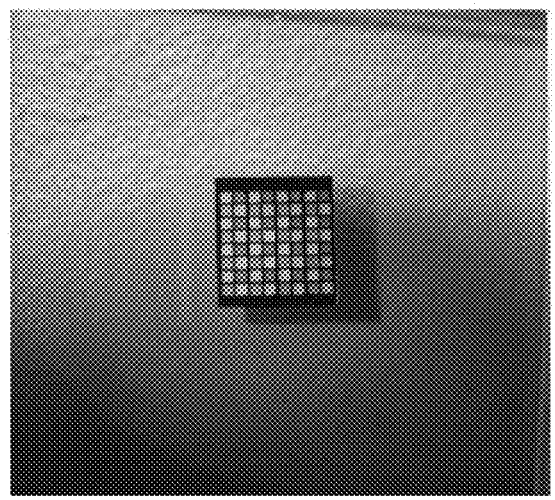
FIG. 29 is a photomicrograph showing excitation results of the silicon mold with red, green and blue phosphors.

FIG. 29 is a photomicrograph showing excitation results of the silicon mold of FIGS. 28A and B with red, green and blue phosphors when exposed to ultraviolet light.

Figure 30:
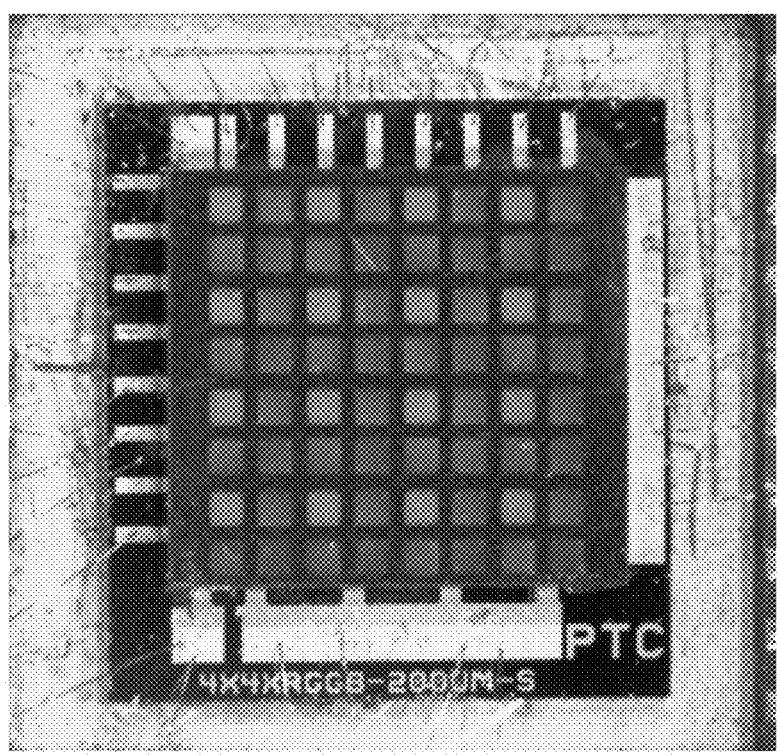
FIG. 30 is a photomicrograph showing an LEDoS display with phosphors mold sitting on the top.

FIG. 30 is a photomicrograph showing a LEDoS display with phosphors inserted into cells of a mold positioned on top of the LEDoS chip. The image shows the finished product of one LED micro-array module integrated on the active matrix substrate after wire-bonding. A silicon mold with phosphors was put on the top of LED micro-array by adhesive.

According to the constitutions described above, individual controllability of each LED pixel in the LED micro-array as well as prevention of cross-talk between neighboring LED pixels is achieved. In addition, the present subject matter provides good luminance uniformity and high drive capability across a large area by driving each LED pixel with an individual pixel circuit, as well as ensuring a small LED pixel pitch and high display resolution. Also, by this constitution, interconnection lines between an output of the AM panel and a p-electrode of the LED pixels is saved. The present subject matter overcomes the incompatibility between the LED process and the CMOS process.

CONCLUSION

It will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. A method for manufacturing a monolithic Light Emitting Diode (LED) micro-display panel on an Active Matrix (AM) panel, the LED microarray panel comprising a plurality of LED pixels each including an n-electrode and a p-electrode, with the LED pixels arranged in a matrix including a plurality of rows and a plurality of columns, n-electrodes of LED pixels in a row of the matrix, electrically connected to a bus line, the p-electrode of each LED pixel individually electrically connected to an output of a corresponding driving circuit on the AM panel, the method comprising:
    providing a substrate of the LED micro-display panel;
    overlaying a plurality of layers of material on a surface of the substrate, with the plurality of overlaying layers of material configured in combination to emit light when activated;
    patterning the plurality of overlaying layers of material by removing a part of each overlaying layers all the way down to the surface of the substrate;
    depositing a current spreading layer on the patterned plurality of overlaying layers of material and surface of the substrate;
    providing a metal multilayer on the current spreading layer;
    patterning the metal multilayer in such a configuration that a first portion of the metal multilayer, which lies on the patterned plurality of overlaying layers of material, and a second portion of the metal multilayer, which lies on the surface of the substrate, and conductively disconnected from the substrate, thereby forming the monolithic LED micro-display panel;
    providing a plurality of active control circuits on a surface of the AM panel; and
    combining the monolithic LED micro-display panel with the AM panel using conductive solder material, with each of the monolithic LEDs electrically insulated from one another and independently controllable by corresponding ones of the active control circuit chips bonded thereto, with the plurality of active control circuits combined with the monolithic LEDs in such a way that each of the plurality of active control circuits combine with one of the monolithic LEDs of the LED microarray panel via the solder material, wherein the AM panel, pixel size and shape correspond to LED pixels.

2. The method of claim 1, further comprising:
    providing a plurality of active control circuits on a surface of the AM panel in such a way that each active control circuit has a two-transistor-one-capacitor (2T1C) structure, which comprises a first transistor (T1) as a switch transistor, a second transistor (T2) as a driving transistor, and a capacitor (C), a gate electrode of the second transistor (T2) electrically connected to a drain electrode of the first transistor (T1) and an end of the capacitor (C), wherein T2 serves as driving transistor, with a select (SEL) switching T1 to an ON mode, and resulting in a signal stored on the capacitor (C) and switching T2 to an ON mode and supply driving current to the respective LED pixel, connected to a drain electrode of T2, so that, after switching T1 to an OFF mode, a voltage at capacitor (C) keeps T2 in ON mode until a next frame.

3. The method of claim 2, further comprising:
    forming the AM panel by a process comprising:
        providing a semiconductor substrate having a surface;

forming active channel of the transistors of active control circuits;
forming gate oxide of the transistors of active control circuits;
forming gate electrodes of the transistors of active control circuits;
forming source and drain of the transistors by using gate electrodes as a self-aligned mask;
forming source and drain electrodes and inter-connection metal line;
forming passivation layer; and
forming via holes on the passivation layer; and,
forming the conductive solder material as a conductive solder bump array that connects the p-electrode of each LED pixel on the LED microarray with the output of each active control circuit on the AM panel in the conductive solder bump array, with a plurality of conductive solder bumps arranged in rows and columns corresponding to the outputs of active control circuits on the AM panel.

4. The method according to claim 3, further comprising:
defining patterns of the plurality of solder bumps on a photoresist;
forming a first ohm contact layer;
forming a thick metal layer on the photoresist;
removing the thick metal layer; and
reflowing in furnace.

5. The method according to claim 1, further comprising:
patterning the plurality of overlaying layers of material by Inductively Coupled Plasma (ICP) etching using Plasma-Enhanced Chemical Vapor Deposition (PECVD) grown SiO2 masks.

6. The method according to claim 1, further comprising patterning of the plurality of overlaying layers of material by removing a part thereof all the way down to the surface of the substrate by an etching process selected from the group consisting of wet etching and dry etching.

7. The method according to claim 1, wherein the substrate of the LED micro-display panel comprises at least one material selected from the group consisting of: GaAs, SiC, semi-insulating GaAs, sapphire, and quartz.

8. The method according to claim 1, comprising:
grouping the LED pixels in groups of four pixels, with the LEDs emitting a single color of light for all pixels;
providing a mold configured to accept phosphors for the individual pixels in each group;
applying phosphors to the mold to transmit at least 3 primary transmission colors for respective ones of the pixels in each group;
applying phosphors to a fourth pixel in the group to transmit light selected from the group consisting of one of the three primary colors, white light, a non-primary color and a fourth primary color.

9. The method according to claim 1, wherein the LED micro-display panel comprises a mold configured to locate red, green, and blue phosphors.

10. The method according to claim 9, wherein the mold comprises a material selected from the group consisting of sapphire, quartz, glass, single crystal silicon, and metal.

11. The method according to claim 9, further comprising:
providing the substrate of the LED micro-display panel on a single crystal silicon wafer;
forming a number of molds onto the surface of the substrate, the molds corresponding to the red, green and blue phosphors onto the surface of substrate to provide a full-color display, the molds formed by etching through the single crystal silicon wafer, and mixing the red, green and blue color phosphors with silicon and then depositing the mixed phosphors and silicon into etching holes on the mold.

12. The method according to claim 1, further comprising configuring the LED pixels to have a circular or rectangular shape.

13. The method according to claim 1, wherein the LED pixels have a pixel size equal to or less than 500×500 $\mu m^2$ in area or 500 μm in diameter.

14. The method according to claim 1, wherein the LED microarray has a display resolution of 8×8 and a display area with a diagonal length of 8 micrometers as a basic unit, a plurality of said basic units can mounted alone the AM panel to obtain a large-scale display panel while improving a utilization rate of LED wafers used to provide the large scale display panel.

15. The method according to claim 1, wherein the LED pixels have a pixel size equal to or more than 10×10 square $\mu m^2$ in area or 10 μm in diameter as a basic unit.

16. The method according to claim 1, wherein the LED microarray has a display resolution of a predetermined size and a display area with a diagonal length of a predetermined size as a basic unit; and
a display area and resolution increased by integrating a plurality of basic units onto a corresponding AM panel.

17. The method according to claim 1, further comprising assembling basic units of the module to provide a standard wherein the resolution of the LED micro-display panel, selected from at least one of 240×160 (HQVGA), 320×240 (QVGA), 640×480 (VGA), 800×480 (WVGA), 800×600 (SVGA), 1024×768 (XGA), 1440×900 (WXGA+), 1680×1050 (WSXGA+), and 1920×1200 (WUXGA).

18. The method according to claim 1, further comprising:
using, as the plurality of overlaying layers, a material comprising a p-GaN layer, a Multiple Quantum Well (MQW) layer, and n-GaN layer;
using, as the metal multilayer, a material comprising a Ti/Al/Ti/Au layer; and
using, as the current spreading layer, a thin layer comprising at least one layer selected from the group consisting of a Ni/Au layer and an Ag/ITO layer.

19. The method according to claim 1, wherein the current spreading layer forms p-electrodes of the LEDs, and the metal multilayer forms n-electrodes of the LEDs and reflective layers on the p-electronics, and wherein the array of the multiple LEDs are arranged in rows, the method further comprising:
connecting the n-electrodes of LEDs in a same row to a common N-bus line that is connected to a ground of the AM panel; and
connecting the p-electrodes of the multiple LEDs individually to outputs of corresponding active control circuit chips by flip-chip bonding the multiple LEDs.

20. The method according to claim 1, further comprising configuring the bus line to limit a forward voltage variation of the LED pixels in the row of the matrix, the configuration to limit forward voltage variation consisting at least one of a varied bus width and a double-side ground structure.

21. The method according to claim 1, further comprising:
providing a passivation layer on the metal multilayer; and
defining openings in the passivation layer containing contact pads configured for the flip-chip bonding with the conductive solder material of the AM panel.

22. The method according to claim 21, further comprising:
using, as the contact pads contained in the openings, a material comprising Ni/Au; and using, as the passivation layer on the metal multilayer, a material comprising at least one material selected from the group consisting of: SiO$_2$, SiNx, polyimide and photoresist.

23. A method for manufacturing an assembly of a monolithic Light Emitting Diode (LED) micro-display panel including a plurality of LEDs thereon and an Active Matrix (AM) panel, comprising:

providing a substrate of the AM panel;

providing active control circuit chips on the substrate of the AM panel, by mounting a plurality of active control circuits on a surface of the AM panel wherein each of the plurality of active control circuits has a two-transistor-one-capacitor (2T1C) structure, which comprises a first transistor (T1) as a switch transistor, a second transistor (T2) as a driving transistor, and a capacitor (C), a gate electrode of the second transistor (T2) electrically connected to a drain electrode of the first transistor (T1) and an end of the capacitor (C);

providing conductive solder material on the active control circuit chips; and using flip-chip bonding to mount the active control chips to the plurality of monolithic LEDs via the conductive solder material to combine the AM panel with the monolithic LED micro-display panel.

24. The method according to claim 23, further comprising:
depositing a passivation layer on the AM panel;
defining holes on the passivation layer;
depositing a seed layer by sputtering on the passivation layer;
coating a photoresist on the seed layer;
patterning the photoresist by photolithography; and
forming the conductive solder material as a conductive solder bump array that connects an electrode of each LED pixel on the LED microarray with the output of each active control circuit on the AM panel in the conductive solder bump array, with the solder bump array corresponding to the outputs of active control circuits on the AM panel.

25. The method according to claim 23, further comprising using a Complimentary Metal-Oxide Semiconductor (CMOS) fabrication process to fabricate the active control circuit chips on the substrate of the AM panel.

26. The method according to claim 23, further comprising:
thinning and dicing the LED micro-display panel; and
flip-chip mounting the diced LED micro-display panel onto the AM panel, with each of the plurality of LEDs on the diced LED micro-display panel faces positioned to correspond to one of the active control circuit chips on the AM panel.

27. A method for manufacturing a monolithic Light Emitting Diode (LED) micro-display panel on an Active Matrix (AM) panel, comprising:

providing a substrate of the LED micro-display panel;

overlaying a plurality of layers of material on a surface of the substrate, and configuring the plurality of overlaying layers of material in combination to emit light when activated;

patterning the plurality of overlaying layers of material by removing a part of each overlaying layers all the way down to the surface of the substrate;

depositing a current spreading layer on the patterned plurality of overlaying layers of material and surface of the substrate;

providing a metal multilayer on the current spreading layer;

patterning the metal multilayer so as to conductively disconnect a first portion of the metal multilayer, which lies on the patterned plurality of overlaying layers of material, from a second portion of the metal multilayer, which lies on the surface of the substrate, thereby forming the monolithic LED micro-display panel; and combining the monolithic LED micro-display panel with the AM panel, said AM panel comprising a plurality of active control circuit chips with conductive solder material, said combining comprising flip-chip bonding the monolithic LEDs to the active control circuit chips via the conductive solder material, with each of the monolithic LEDs electrically insulated from one another and independently controllable by corresponding ones of the active control circuit chips bonded thereto;

grouping the LED display to form pixels in groups of four pixels, with the LEDs emitting a single color of light for all pixels;

providing a mold configured to accept phosphors for the individual pixels in each group;

applying phosphors to the mold to transmit at least 3 primary transmission colors for respective ones of the pixels in each group;

applying phosphors to a fourth pixel in the group to transmit light selected from the group consisting of one of the three primary colors, white light, a non-primary color and a fourth primary color.

* * * * *